United States Patent [19]
Nakazawa et al.

[11] Patent Number: 5,948,200
[45] Date of Patent: Sep. 7, 1999

[54] METHOD OF MANUFACTURING LAMINATED CERAMIC ELECTRONIC PARTS

[75] Inventors: Mutsuo Nakazawa; Hiroshi Takahashi, both of Tokyo, Japan

[73] Assignee: Taiyo Yuden Co., Ltd., Tokyo, Japan

[21] Appl. No.: 08/686,751

[22] Filed: Jul. 26, 1996

[51] Int. Cl.$^6$ .................................................. B32B 31/12
[52] U.S. Cl. .................. 156/248; 156/89.16; 156/246; 156/249; 156/252; 156/257; 156/272.8
[58] Field of Search ............................. 156/89, 64, 230, 156/231, 233, 235, 238, 247, 248, 249, 252, 257, 264, 272.8, 277, 261, 246, 89.12, 89.16; 264/400, 61; 427/96; 83/875, 30, 929.1; 29/851, 846; 372/15, 103

[56] References Cited

U.S. PATENT DOCUMENTS

| | | | |
|---|---|---|---|
| 3,742,182 | 6/1973 | Saunders | 264/400 X |
| 3,956,052 | 5/1976 | Koste et al. | 156/268 X |
| 4,497,677 | 2/1985 | Sanada et al. | 156/89 |
| 4,546,065 | 10/1985 | Amendola et al. | |
| 4,764,233 | 8/1988 | Ogihara et al. | 156/89 |
| 4,802,945 | 2/1989 | Opina | 156/89 X |
| 4,889,573 | 12/1989 | Stein et al. | 156/89 |
| 5,006,182 | 4/1991 | Gantzhorn, Jr. et al. | 156/89 |
| 5,009,744 | 4/1991 | Mandai et al. | 156/89 X |
| 5,087,396 | 2/1992 | Zablotny et al. | 264/400 |
| 5,271,150 | 12/1993 | Inasaka | 156/89 X |
| 5,294,567 | 3/1994 | Dorfman et al. | |
| 5,314,711 | 5/1994 | Baccini | 427/96 X |
| 5,316,602 | 5/1994 | Kogame et al. | 156/89 X |
| 5,372,666 | 12/1994 | Kawasaki | 156/89 |
| 5,412,865 | 5/1995 | Takaoka et al. | 156/89 X |
| 5,446,755 | 8/1995 | Yoshida et al. | |
| 5,480,503 | 1/1996 | Casey et al. | 156/89 |
| 5,573,620 | 11/1996 | Sakai et al. | 156/89 X |
| 5,597,412 | 1/1997 | Grilletto et al. | |

FOREIGN PATENT DOCUMENTS

| | | |
|---|---|---|
| 0 456 243 | 11/1991 | European Pat. Off. . |
| 7-192921 | 7/1995 | Japan . |
| 7-192953 | 7/1995 | Japan . |
| 7-192954 | 7/1995 | Japan . |
| 7-192955 | 7/1995 | Japan . |
| 7-192956 | 7/1995 | Japan . |
| 7-193374 | 7/1995 | Japan . |
| 7-193375 | 7/1995 | Japan . |

*Primary Examiner*—Curtis Mayes
*Attorney, Agent, or Firm*—Lowe Hauptman Gopstein Gilman & Berner

[57] ABSTRACT

A method useful for the manufacture of multilayer ceramic electronic components such as a multilayer chip inductor, a multilayer transformer, a multilayer hybrid components containing a coil conductor, and the like comprises a process A for preparing a ceramic green sheet, a process B for forming a through hole to the ceramic green sheet, a process C for forming a conductor pattern on the ceramic green sheet, and a process D for stacking said ceramic green sheet to another ceramic green sheet, wherein said process B is executed by irradiating a laser beam onto the ceramic green sheets so as to form through holes to the fragile ceramic green sheet with a pinpoint accuracy.

4 Claims, 33 Drawing Sheets

(a)

(b)

(a)

(b)

METHOD OF MANUFACTURING LAMINATED CERAMIC ELECTRONIC PARTS

FIELD OF THE INVENTION

The present invention relates to a method of manufacturing multilayer ceramic electronic components, such as a multilayer chip inductor, a multilayer transformer, a multilayer hybrid component containing a coil conductor, and the like.

BACKGROUND OF THE INVENTION

A known method of manufacturing a multilayer chip inductor as one type of multilayer ceramic electronic component, such as a multilayer chip inductor, is described below.

First, ceramic slurry prepared by mixing magnetic ceramic powder with binder and solvent is coated onto a base film composed PET or the like using a doctor blade to thereby form a green sheet of about tens of microns thick. Next, the green sheet on the base film is cut to a predetermined size and the cut green sheet is peeled from the base film. Then, a multiplicity of through holes are formed to the peeled green sheet in a predetermined disposition. Subsequently, conductor paste prepared by mixing metal powder, binder and solvent is printed to the peeled green sheet using a screen printer and a conductor pattern for a coil is formed to overlap the every through hole with the end of pattern. Next, the green sheets each having the conductor pattern formed thereon are stacked together with dummy sheets in a predetermined order and pressed into one body. Then, the thus obtained pressed member is cut to dimensions corresponding to respective components and the multilayer chips having been cut are fired. Subsequently, conductor paste serving as external electrodes is coated to the predetermined positions of the multilayer chip having been fired and re-fired. The multilayer chip inductor is made by the above processes.

Since this type of the multilayer ceramic electronic components including the above multilayer chip inductor need a process for forming the through hole to the green sheet for connecting the conductor pattern through the green sheet in the manufacturing process. The through hole forming process is executed in such a manner that the green sheet is inserted between a vertically movable upper mold having a punch and a lower mold having a die hole corresponding to the punch and a hole is punched to the green sheet by raising and lowering the upper mold while moving the green sheet, or the upper mold and the lower mold.

However, the above through hole forming method has a problem that since the mechanical vibration and impact resulting from the vertical movement of the upper mold is liable to be transmitted to the green sheet and further the upper mold and the lower mold come into contact with the green sheet in processing, by which the fragile green sheet is dislocated and deformed and the accuracy of shape and the positional accuracy of the through hole is adversely affected.

Since the green sheet used to manufacture the ceramic multilayer electronic components is very weak in strength because its thickness is only about tens of microns, it is liable to be subjected to deformation such as a wrinkle, a broken shape and the like while it is transported between respective processes, which causes a problem that the electrical properties of components are dispersed and trouble is additionally required to remove a deformed green sheet.

Since the conductor pattern is formed by directly printing the fluid conductor paste to the green sheet, there is a problem that when the ceramic green sheet has pinholes, cracks and the like, the conductor paste invades into the portions and causes failures such as the change of inductance, short-circuit and the like. In addition, there is also a problem that when the solvent contained in the conductor paste is not suitable with the green sheet, the solvent penetrates into the ceramic green sheet and makes a sheet attack (tear) or makes deformation such as a shrinkage or a wrinkle in firing, so that the positional accuracy of the conductor pattern and the relative accuracy between the conductor pattern and the through hole are greatly lowered.

Further, since the punching process using the upper mold and the lower mold fundamentally forms a penetrated, when the process is applied to the green sheet formed on the base film, through hole is also formed to the base film as well as the green sheet. Therefore, when the conductor pattern is formed to the green sheet, the conductor paste is filled up to the through hole of the base film in printing. Thus, there arise problems that when the green sheet is peeled from the base film, since the conductor paste filled in the through hole is almost left to the base film side, the fragile green sheet is broken, the amount of the paste in the through hole is reduced and the conductor pattern cannot be satisfactorily connected.

DISCLOSURE OF THE INVENTION

A first object of the present invention is to provide a method of properly and stably manufacturing multilayer ceramic electronic components by forming through holes to a fragile ceramic green sheet with a pinpoint accuracy.

A second object of the present invention is to provide a method of properly and stably manufacturing multilayer ceramic electronic components by preventing the deformation of the fragile green sheet.

A third object of the present invention is to provide a method of properly and stably manufacturing multilayer ceramic electronic components by solving the problem caused when fluid conductor paste is directly printed to a green sheet.

A fourth object of the present invention is to provide a method of properly and stably manufacturing multilayer ceramic electronic components by forming through holes only to the green sheet without damaging a base film.

According to the invention, a multilayer ceramic electronic component is formed by a process A for preparing a ceramic green sheet, a process B for forming a through hole in the ceramic green sheet, a process C for forming a conductor pattern on the ceramic green sheet, and a process D for stacking the ceramic green sheet to another ceramic green sheet, wherein the process B is executed by irradiating the ceramic green sheets with a laser beam.

In a preferred embodiment, process B is executed by irradiating a light transmitting portion of a mask with a laser beam and irradiating the ceramic green sheet with the laser beam that passed through the mask light transmitting portion.

Preferably process B is executed by irradiating a light transmitting portion of a mask with a laser beam reflected by a galvano-mirror. After the reflected beam has passed through the mask light transmitting portion, it is incident on the ceramic green sheet.

Process B is also executed by propagating the laser beam through the mask light transmitting portion, focusing the laser beam that passed through the light transmitting portion and irradiating the ceramic green sheet with the focused laser beam so the beam has an image-forming ratio whereby the ceramic green sheet is irradiated by a smaller area beam than the area of the beam propagating through the mask light transmitting portion.

Since the through holes are formed in the green sheet by irradiating the sheet with a laser beam, the through holes are formed with pinpoint accuracy without damaging the base film, thus the problem of the abnormal connection of the conductor patterns caused by poor shape of the through holes is largely prevented. Further, since conventional mechanical vibration and impact are not applied to the ceramic green sheet in processing, dislocation and deformation resulting from contact do not arise in the green sheet. The accuracy reduction caused by the dislocation and deformation are largely prevented, to enable the through holes to be formed with pinpoint accuracies of shape and position.

Preferably, process A is executed by forming a ceramic green sheet on a base film, and the process D is executed by stacking the ceramic green sheet on another ceramic green sheet and peeling the base film from the stacked green sheet. Process C is preferably executed by forming the conductor pattern on the base film and forming the green sheet on the base film on which the conductor pattern is formed. Process D is preferably executed by stacking the ceramic green sheet on another ceramic green sheet and peeling the base film from the stacked green sheet.

Process A is preferably executed by forming the ceramic green sheet on a base film, and the process D is executed by cutting the ceramic green sheet on the base film to a predetermined size. The cut ceramic green sheet is peeled from the base film and the peeled ceramic green sheet is stacked on the another ceramic green sheet.

Since the green sheet and the conductor pattern are handled while they are adhered to the base film, the film, green sheet and pattern are easily transported, stacked and otherwise moved compared with the conventional method of handling the green sheet as an independent member. In the present invention there is a substantial reduction in the deformation (such as a wrinkle, collapse of a shape) of the green sheet and the conductor pattern. The reduction in deformation causes a decrease in troubles and dispersion of electrical properties so that the multilayer ceramic electronic components can be properly and stably manufactured. The green sheets are securely stacked with pinpoint accuracy by determining the positions of the stacked green sheets with a guide means using the strong base films as a reference.

Preferably, process C is executed by preparing a transfer film composed of a base film on which a conductor layer is formed and thermally transferring the conductor layer of the transfer film onto the ceramic green sheet in a predetermined pattern shape.

Process C is preferably executed by preparing a transfer film composed of a base film on which a conductor pattern is formed and thermally transferring the conductor pattern of the transfer film onto the ceramic green sheet.

Since the conductor layer adhered to the base film is thermally transferred to the green sheet in a predetermined pattern or the conductor pattern formed in the base film is thermally transferred to the green sheet, the invasion of conductor paste into defective portions of the green sheet is suppressed; pinholes and cracks are examples of the defects that can occur. Thereby component failures, such as a change of inductance, short-circuit and the like are largely prevented. Moreover, since almost no solvent is contained in the transferred conductor pattern, the problems of sheet attack and deformation in baking caused by the penetration of the solvent are substantially prevented before they can arise, causing an improvement in positional accuracy of the conductor patterns, as well as the relative accuracy between the conductor patterns and the through holes.

Preferably the laser beam irradiating the green sheets is pulsed to have a predetermined peak pulse power and pulse duration. The values of peak pulse power and the pulse duration are set so that the product of them equals a quantity of heat capable of melting and vaporizing a volume of green ceramic sheet material corresponding to the volume of a through hole in the sheet, and the pulse duration is restricted to a time range in which the temperature of the base film does not reach the melting temperature thereof.

The through holes are formed only in the ceramic green sheet without damage to the base film whereby good quality through holes without residual dregs and the like are precisely and accurately formed in the green ceramic sheets. The through holes are formed in the green ceramic sheets without causing damage, such as irregular portions, recesses and the like, to the base film under the through holes. With this arrangement, when the conductor pattern is formed on the green sheet, the through holes can be properly filled with paste. In addition, the green ceramic sheet does not break as often as has occurred in the prior art and the problem of leaving residual paste when the green sheet is peeled from the base film is solved to thereby greatly improve the productivity of the multilayer ceramic electronic components.

Objects, arrangements and advantages other than the above will be made clear in the following detailed description of the invention.

DESCRIPTION OF PREFERRED EMBODIMENTS

FIG. 1–FIG. 12 are figures of a first embodiment in which the present invention is applied to a multilayer chip inductor. A method of manufacturing the multilayer chip inductor according to the first embodiment is described below with reference to the figures.

Figure 1:
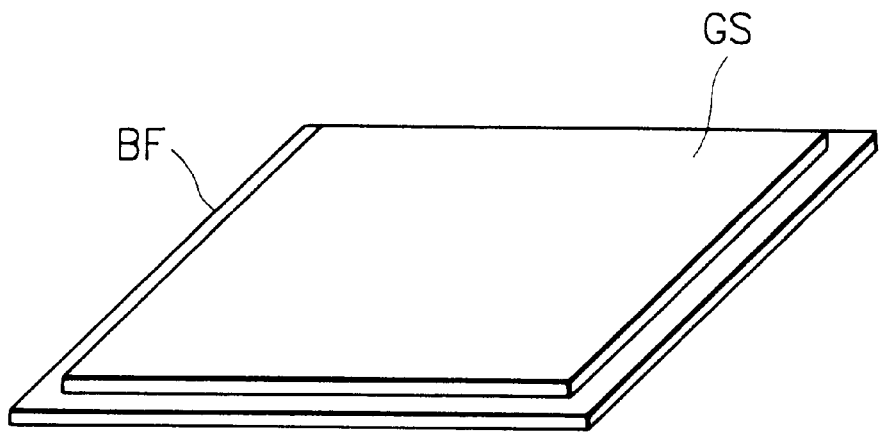
FIG. 1 is a perspective view showing the state that a green sheet is formed on a base film.

First, a ceramic green sheet GS is formed by coating ceramic slurry prepared by mixing binder and solvent with Ni-Zn-Cu ferrite powder onto a rectangular base film BF of about 100 $\mu$m thick composed of PET or the like to a thickness of about 50 $\mu$m (refer to FIG. 1).

Figure 2:
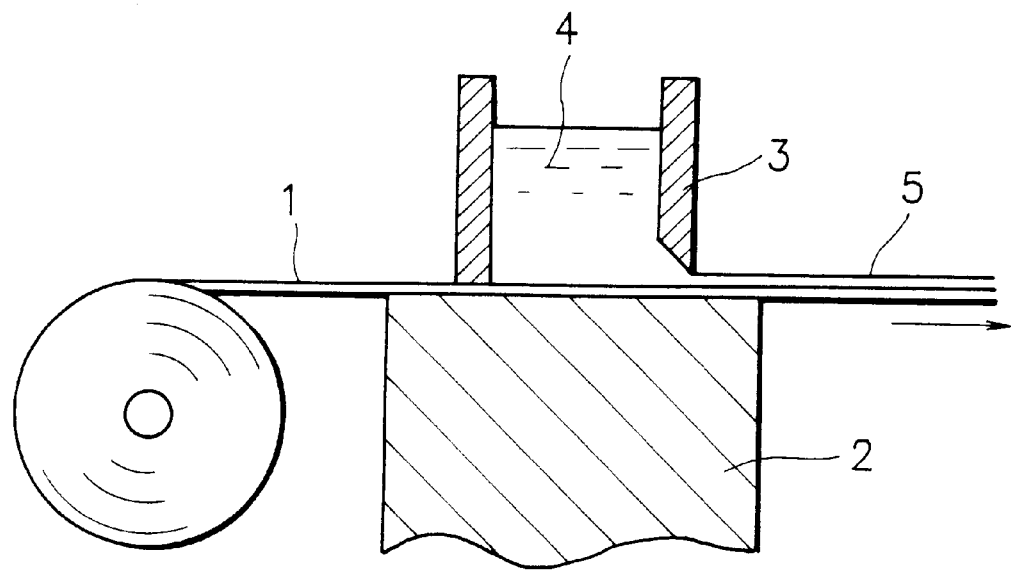
FIG. 2 is a view showing an arrangement of a slurry coating apparatus.

The green sheet GS is formed using a slurry coating apparatus shown in FIG. 2. In the figure, numeral 1 denotes a band-shaped base film, numeral 2 denotes a table for supporting the base film 1, numeral 3 denotes a coating frame disposed on the table 2 across the base film 1, numeral 4 denotes ceramic slurry filled in the coating frame 3, and numeral 5 denotes a ceramic green sheet formed on the base film 1 by applying the ceramic slurry to the film. The base film 1 is wound to a roll shape on the base end side thereof and the other end thereof is pulled so as to be movable in the direction of the arrow.

When the base film 1 is moved on the table 2 at a predetermined speed in the direction of the arrow, the ceramic slurry 4 in the coating frame 3 is uniformly coated on the upper surface of the base film 1 to a thickness in accordance with the gap between the base film 1 and the coating frame 3 so that the ceramic green sheet 5 is formed.

Figure 3:
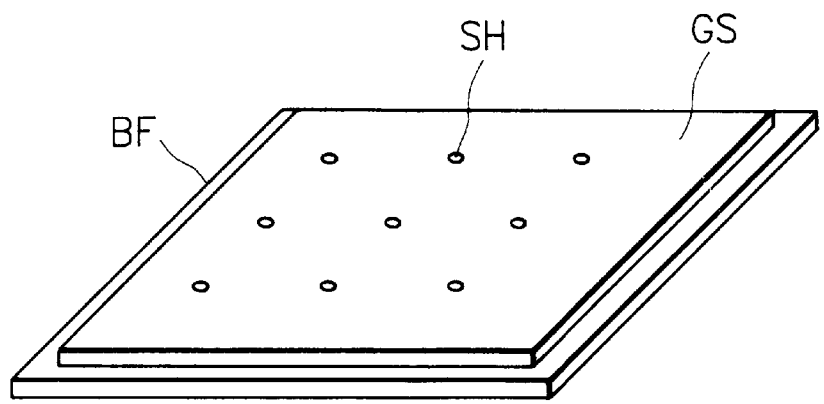
FIG. 3 is a perspective view showing the state that through holes are formed to a green sheet on a base film.

Next, about 50 $\mu$m diameter through holes SH corresponding in number to the number of components to be formed are drilled in the green sheet GS of FIG. 1 in a predetermined disposition (refer to FIG. 3).

Figure 4:
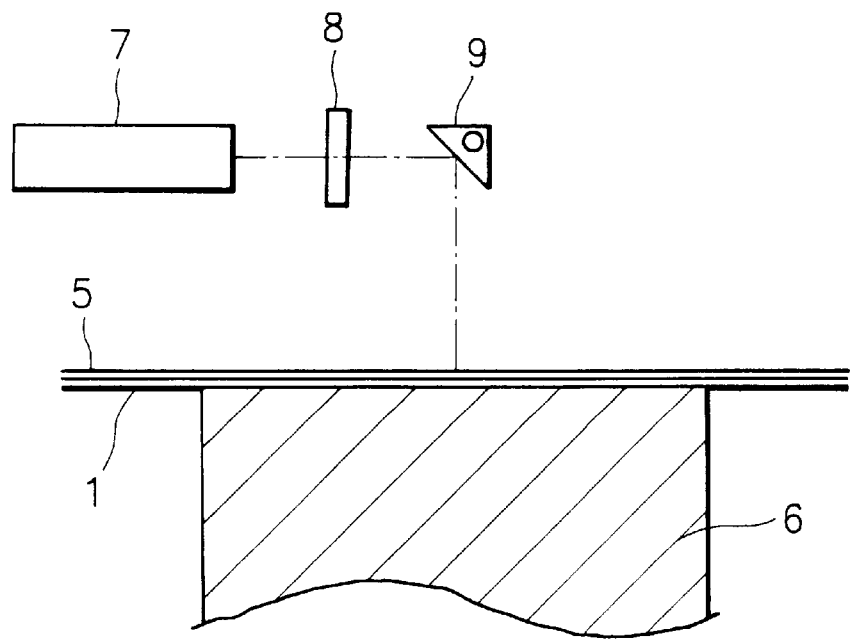
FIG. 4 is a view showing an arrangement of a laser processing apparatus.
Figure 7:
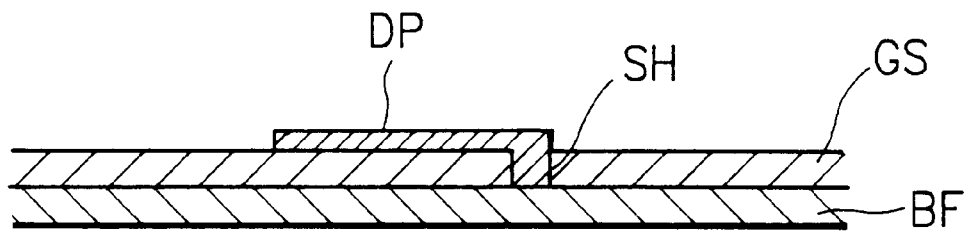
FIG. 7 is a cross-sectional view of the portion of a green sheet where a conductor pattern is formed.

The through holes SH are formed using a laser processing apparatus shown in FIG. 4. In the figure, numeral 1 denotes a base film, numeral 5 denotes a ceramic green sheet formed on the base film 1, numeral 6 denotes a table for supporting the base film 1, numeral 7 denotes a laser oscillator such as a YAG or the like capable of generating a normal pulsed laser beam for irradiating the green ceramic sheet 5 to form through holes SH, numeral 8 denotes a light transmitting portion corresponding to the through hole such as, for example, a glass mask having a transparent or semi-transparent portion, a hole or the like which permits the transmission of light rays from laser 7, and numeral 9 denotes a galvano-mirror having two degrees of freedom. As illustrated in FIG. 7, through hole SH is drilled by the laser beam so the through hole does not penetrate base film BF and does not materially penetrate the base film.

When the green sheet 5 with the base film is stopped on the table 6, the normal pulse laser beam generated by the laser oscillator 7 is generated to the mask 8; the laser beam after passing through the light transmitting portion of the mask 8 is focused by a lens (not shown) to irradiate the green sheet 5 at a predetermined image forming ratio. The position on sheet 5 irradiated by the beam is changed by the galvano-mirror 9 each time the beam is derived. The portion of the green sheet 5 irradiated by the laser beam is melted and evaporated, whereby a multiplicity of through holes, equal in number to the number of components to be formed, are formed in the green sheet 5 in the predetermined disposition. If a plurality of holes are formed in the mask 8 and a plurality of laser beams simultaneously irradiate the magnetic green sheet 5, the period of time needed to form the through holes is reduced.

Figure 5:
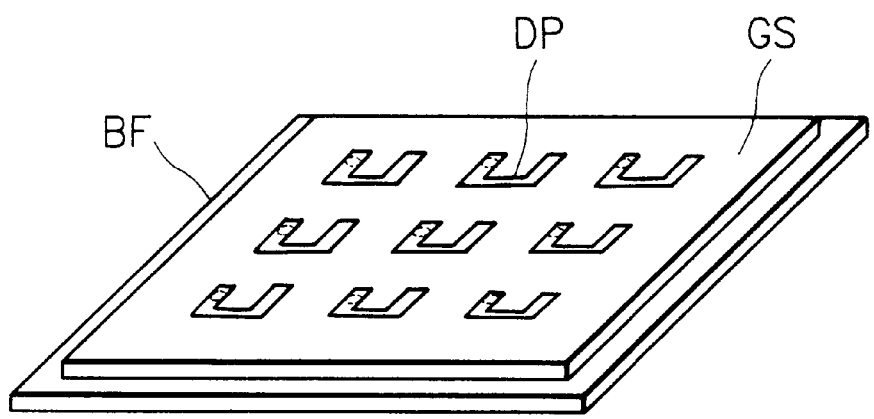
FIG. 5 is a perspective view showing the state that conductor patterns are formed to the green sheet to which the through holes have been formed.

Next, conductor paste prepared by mixing binder and solvent with Ag powder is printed onto the green sheet GS of FIG. 3 to a thickness of about 30 $\mu$m to thereby form a number of coil conductor patterns DP equal to the number of components to be formed in a predetermined disposition (refer to FIG. 5). The respective conductor patterns DP are formed so that the connecting end thereof overlaps with the through holes SH and the through holes SH are filled with a portion of the conductor paste as shown in FIG. 7.

Figure 6:
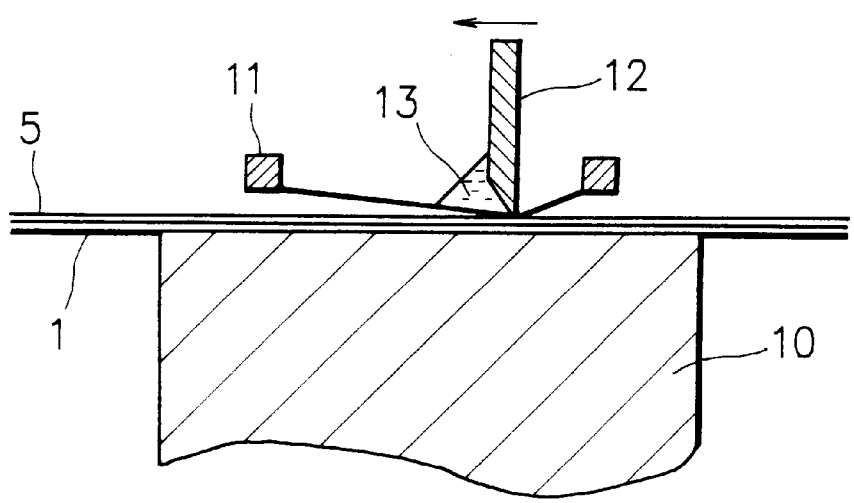
FIG. 6 is a view showing an arrangement of a screen printer.

The conductor pattern DP is formed using a screen printer shown in FIG. 6. In the figure, numeral 1 denotes a base film, numeral 5 denotes a green sheet formed on the base film 1, numeral 10 denotes a table for supporting the base film 1, numeral 11 denotes a screen, numeral 12 denotes a squeegee, and numeral 13 denotes conductor paste placed on the screen 11. The screen 11 can move in X- and Y-directions relative to base 1 and the squeegee 12 can reciprocatingly move longitudinally of base 1 in the direction of an arrow, respectively and the conductor paste 13 is automatically supplied onto the screen 11 in a predetermined amount every time printing is executed.

When the squeegee 12 is moved in the direction of the arrow and the conductor paste 13 on the screen 11 is printed onto the green sheet 5 through the screen 11 after the green sheet 5 to which the through holes have been formed is stopped on the table 10 and the screen 11 is positioned using the through holes SH sensed by a visual sensor or the like as a reference, a multiplicity f the conductor patterns are formed in a predetermined disposition on the green sheet 5 to which the through holes have been formed with the connecting ends thereof overlapped with the respective through holes.

Figure 8:
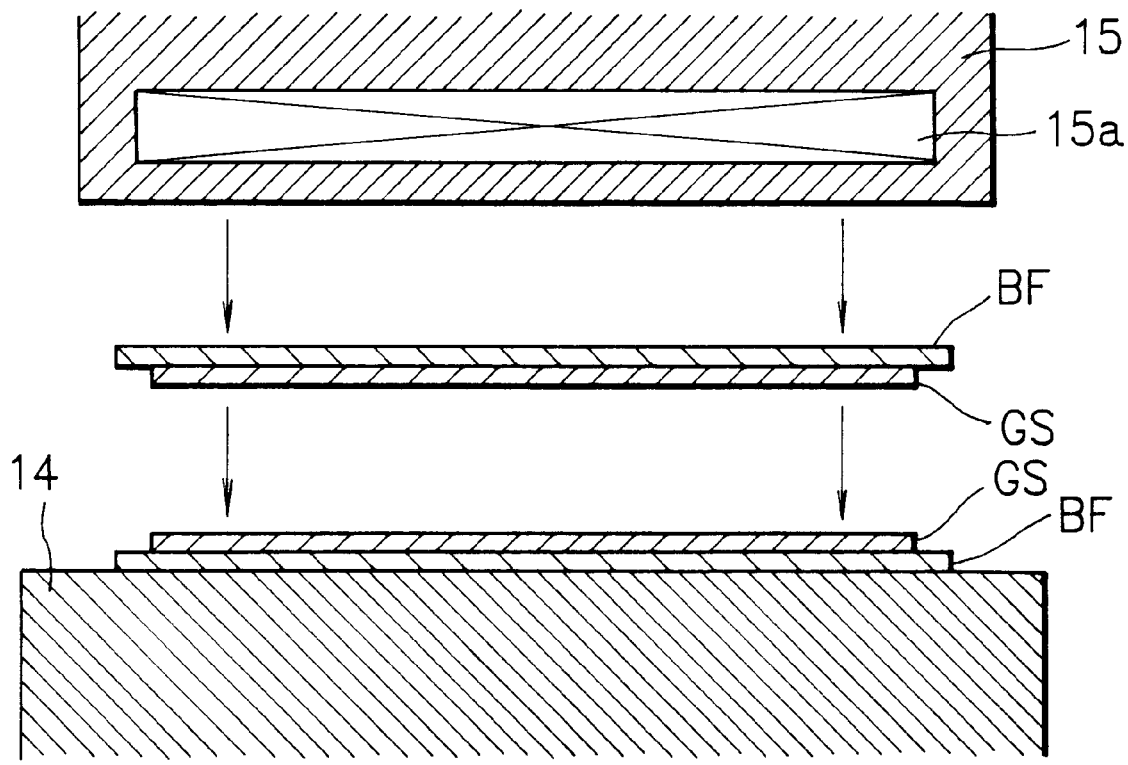
FIG. 8 is a view showing a green sheet stacking procedure.

Next, as shown in FIG. 8, a multilayer structure is formed by placing the green sheet GS with the base film BF shown in FIG. 1 on the table 14 with the green sheet GS directed upward. A green sheet on a base film BF is then positioned so the base film BF thereof is directed upward. The green sheets and base layers are thermally stacked to each other by a thermally vertically moveable stacking plate 15 containing a heater 15$a$. Thermal stacking is performed at a pressure of 25–45 kg/m$^2$, a temperature of 70–80° C. and a stacking time of 5 seconds or longer. Although not shown, a means such as, for example, air suction holes, adhesive tapes or the like is provided with the table 14 to fix the lowermost base film BF to the table side. A guide bar, a guide frame and the like are also provided therewith to position the base films BF when they are stacked.

Figure 9:
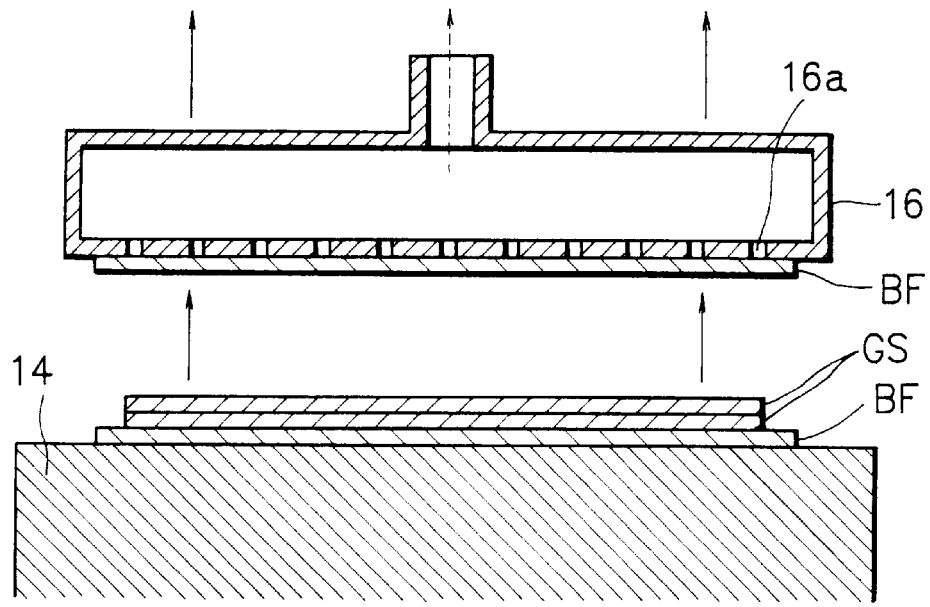
FIG. 9 is a view showing a base film peeling procedure.

Next, as shown in FIG. 9, a vertically moveable adsorption plate 1 having air suction holes 16$a$ formed in the lower surface thereof contacts the uppermost base film BF. A suction force (shown by a dotted line in the drawing) is applied to plate 16 simultaneously with the contact and then adsorption plate 16 is moved upward to peel the upper base film BF from the green sheet GS. Since the adhesive force between the green sheet and the base film BF is smaller than the adhesive force between the thermally stacked green sheets GS, the film is peeled by the upward movement of the adsorption plate 16 without deforming the green sheet GS. The thermal stacking and film peel are sequentially repeated until a predetermined number of green sheets GS having no through holes SH and having the conductor pattern DP formed thereon is stacked.

Figure 10:
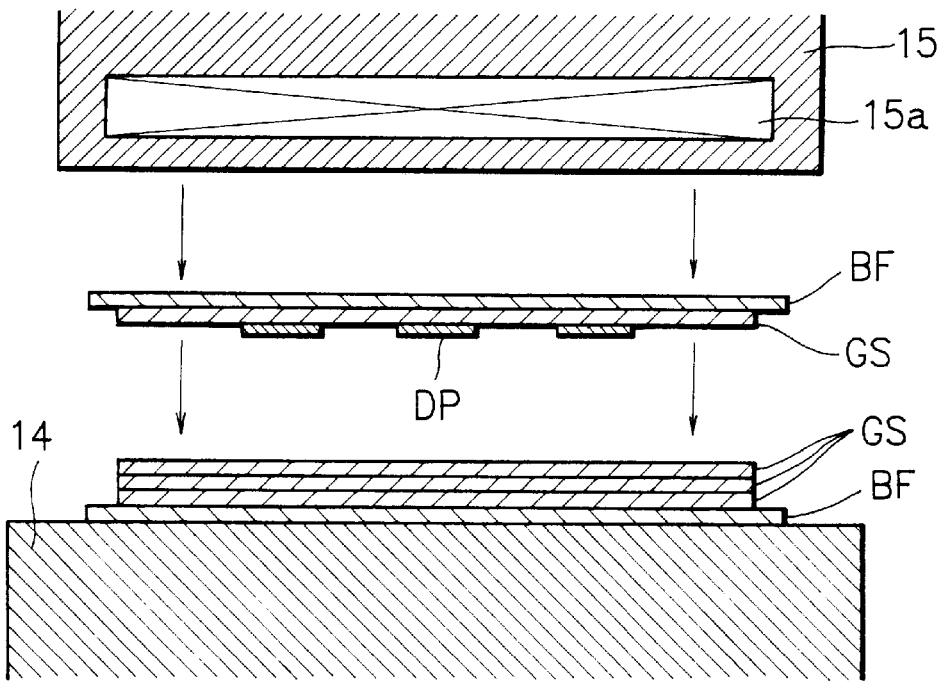
FIG. 10 is a view showing a green sheet stacking procedure.

Next, the green sheet GS with the base film BF having the through holes SH and the conductor patterns DP shown in FIG. 5 is thermally stacked (by thermal stacking plate 15) to the thus stacked green sheets GS with the base film BF directed upward as shown in FIG. 10.

Figure 11:
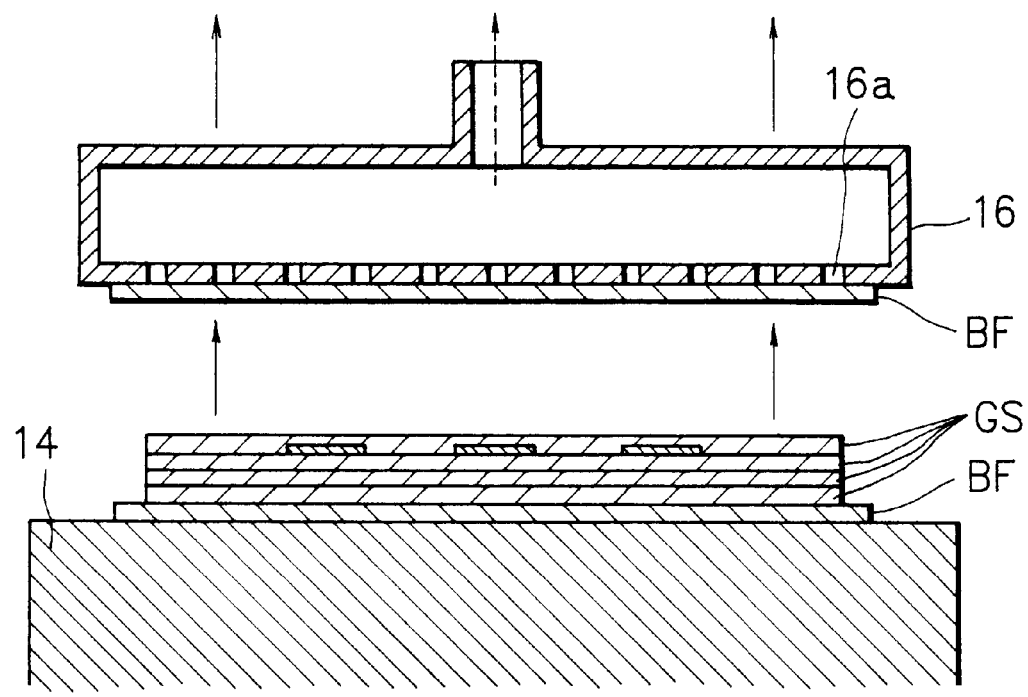
FIG. 11 is a view showing a base film peeling procedure.

Next, the base film BF of the thermally stacked green sheet GS is peeled by the adsorption plate 16, as shown in FIG. 11. Since the adhesive force between the green sheet GS and the base film BF is also smaller than the adhesive force between the thermally stacked green sheets GS in this case, the film BF is peeled from the ceramic green sheet GS by the upward movement of the adsorption plate without causing the deformation of the green sheet GS. The thermal stacking and film peeling operations are sequentially repeated until a predetermined number of the green sheets GS (each having the through holes SH and the conductor pattern DP) is stacked.

Figure 12:
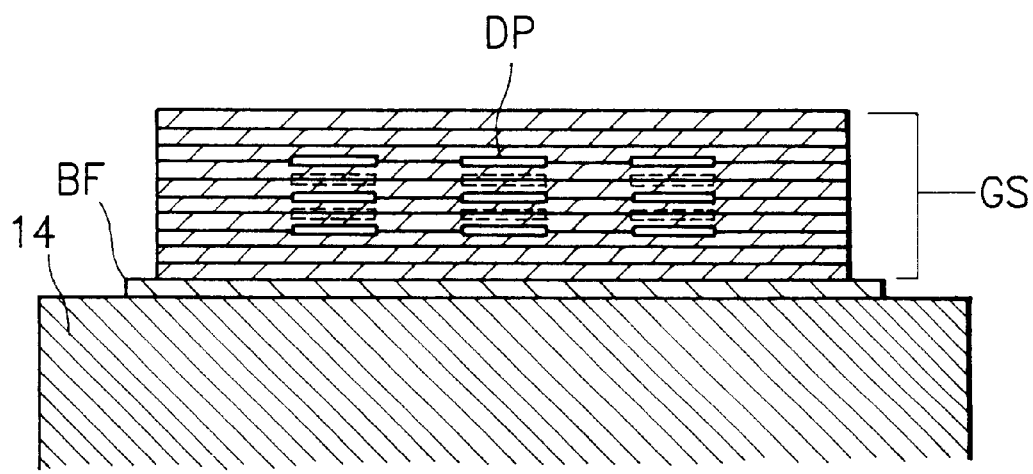
FIG. 12 is a view showing the state that green sheets have been stacked.

Next, the green sheet GS with the base film BF shown in FIG. 1 is thermally stacked (by thermal stacking plate 15) to the thus stacked green sheets GS with the base film BF directed upward; this operation is similar to the operation shown in FIG. 12. Base film BF is then peeled by an adsorption plate 16 in a process similar to that previously described. The thermal stacking and film peel are sequentially repeated until a predetermined number of the green sheets GS having no through holes SH and conductor pattern DP formed thereon is stacked.

Next, the laminated structure on the table 14 (FIG. 12) is cut to the dimensions corresponding to respective components and the binder in the conductor paste (originally including binder, solvent and Ag powder) is removed from the laminated chips. The chips are cut at 500° C. under atmospheric atmosphere and further fired at about 900° C. under atmospheric atmosphere. After the firing, conductor paste for external terminals is coated at predetermined positions on the outside surface of each of the multilayer chips. Then the chips are re-fired at about 600° C. under atmospheric atmosphere. The manufacture of the multilayer chip inductors is finished by the above processes.

According to the above manufacturing method, the green sheet GS and the conductor pattern DP can be handled in the state that they are held by the base film BF, jobs for transportation, stacking and the like can be very easily carried out as compared with a conventional method of handling the green sheet GS as an independent member. Thus, deformations, such as wrinkles, collapses of a shape and the like in the green sheet GS and the conductor pattern DP are avoided and there is a decrease of problems associated with dispersion of electrical properties caused by the deformation, so that the multilayer chip inductors are properly and stably manufactured.

Since the green sheets GS can be positioned by the guide means using the strong base film BF as the reference when they are stacked, the green sheets GS can be reliably stacked with pinpoint accuracy.

Further, since the through holes SH are formed in the green sheet GS by irradiating the sheet with a laser beam, holes serving as the through holes SH are accurately formed only in the green sheet GS without damaging the base film BF. Thus problems of abnormal connections between conductor patterns DP resulting from poor formation of the shape of the through hole SH are largely prevented.

FIG. 13–FIG. 16 are figures of a second embodiment in which the present invention is applied to a multilayer chip inductor. A method of manufacturing the multilayer chip inductor according to the second embodiment will be described with reference to the figures.

First, a green sheet GS is formed by coating ceramic slurry prepared by mixing binder and solvent with Ni-Zn-Cu ferrite powder onto a rectangular base film BF of about 100 $\mu$m thick composed of PET or the like to a thickness of abut 50 $\mu$m likewise the first embodiment (refer to FIG. 1). The slurry coating apparatus shown in FIG. 2 is used to form the green sheet GS.

Figure 13:
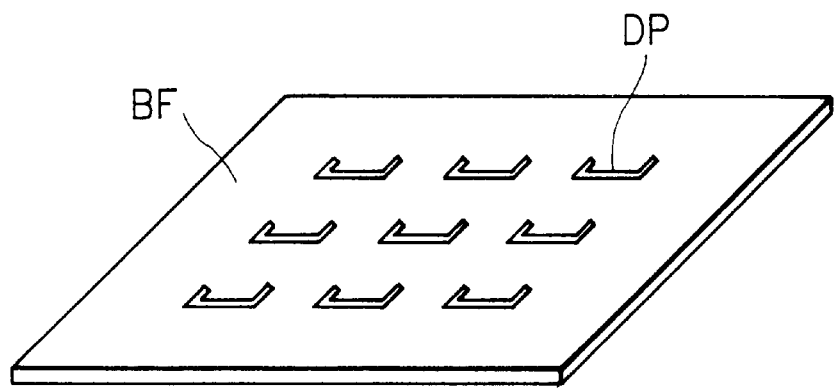
FIG. 13 is a perspective view showing the state that conductor patterns are formed on a base film.

Next, conductor paste prepared by mixing binder and solvent with Ag powder is printed onto the rectangular base film to a thickness of about 30 $\mu$m to thereby form coil conductor patterns DP as many as components to be obtained in a predetermined disposition (refer to FIG. 13). The screen printer shown in FIG. 6 is used to form the conductor patterns DP.

Figure 14:
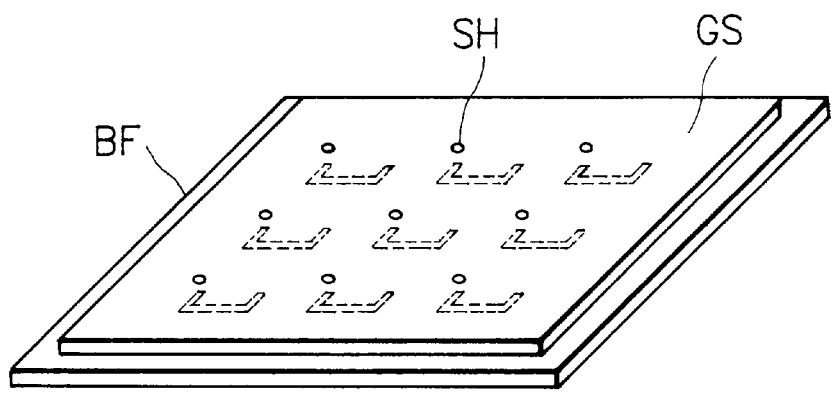
FIG. 14 is a perspective view showing the state that a green sheet is formed on the base film to which the conductor patterns have been formed.

Then, a green sheet GS is formed by coating ceramic slurry prepared by mixing binder and solvent with Ni-Zn-Cu ferrite powder onto the base film BF of FIG. 13 to a thickness of about 50 $\mu$m and about 50 $\mu$m diameter through holes SH as many as components to be obtained are formed to the green sheet GS in a predetermined disposition in such a manner that the through holes SH communicate with the connection terminals of the respective conductor patterns DP (refer to FIG. 14). The slurry coating apparatus shown in FIG. 2 is used to form the green sheet GS and the laser processing apparatus shown in FIG. 4 is used to form the through holes SH.

Figure 15:
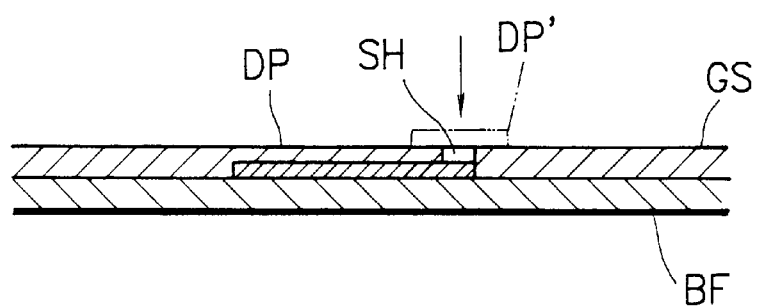
FIG. 15 is a cross-sectional view of the portion of a green sheet where a conductor pattern is formed.

Next, as shown by the dotted line in FIG. 15, another conductor pattern DP' is formed onto the green sheet GS of FIG. 14 so that the conductor pattern DP' is partially overlapped with the through hole SH by a similar method. Conductor paste is filled in the through hole SH simultaneously with the formation of the pattern (refer to the thick arrow in the figure). Note, this process is not always necessary when the conductor pattern DP under the through hole is partially enter the through hole SH when the through hole are formed.

Next, the green sheet GS with the base film BF shown in FIG. 1 is placed on the table 14 with the green sheet GS directed upward and a similar green sheet GS is stacked thereto with the base film BF thereof directed upward, they are thermally stacked to each other by a thermally stacking plate similar to that of the first embodiment and the base films BF are peeled by an adsorption plate similar to that of the first embodiment likewise. The thermal stacking and film peel are sequentially repeated until the predetermined number of the green sheets.GS having no through hole SH and conductor pattern DP formed thereto are stacked.

Figure 16:
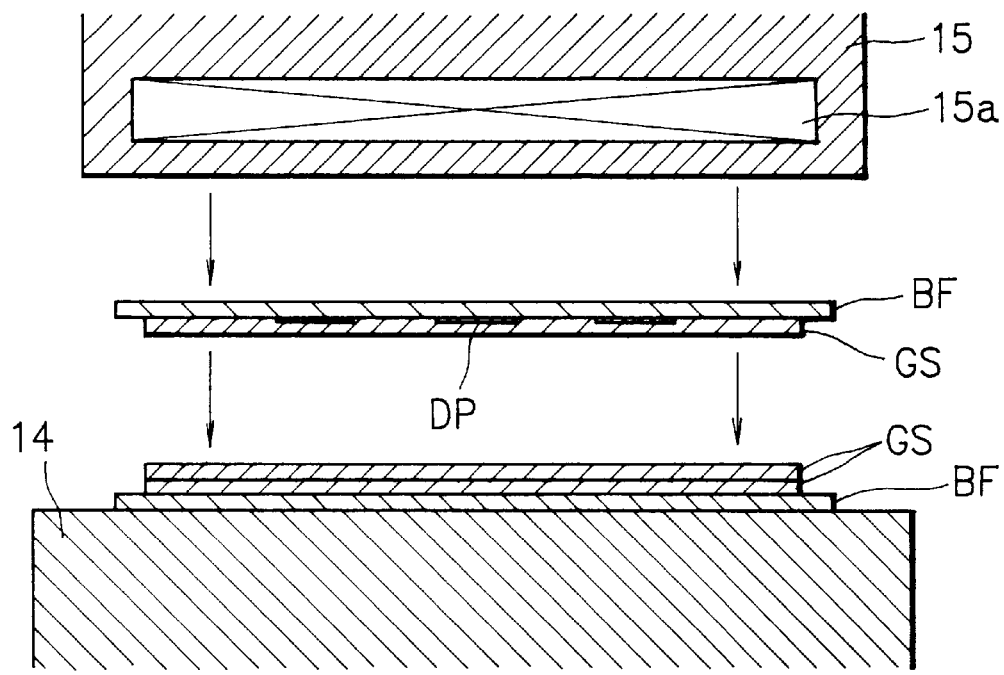
FIG. 16 is a view showing a green sheet stacking procedure.

Next, the green sheet GS with the base film BF having the through holes SH and the conductor patterns DP shown in FIG. 14 is stacked to the thus stacked green sheets GS with the base film BF directed upward as shown in FIG. 16 and thermally stacked by a thermally stacking plate 15 similar to that of the embodiment 1 likewise and the base film BF is peeled by an adsorption plate similar to that of the first embodiment. Although the conductor patterns DP are disposed between the base film BF to be peeled and the green sheet GS in the embodiment, since the sticking force between the conductor patterns DP and the base film BF is smaller than the sticking force between the conductor patterns DP and the green sheet GS, the film can be peeled well by the upward movement of the adsorption plate without deforming the conductor patterns DP. The thermal stacking and film peel are sequentially repeated until the predetermined number of the green sheets GS having the through holes SH and the conductor patterns DP are stacked.

Next, the green sheet GS with the base film BF shown in FIG. 1 is stacked to the stacked green sheets GS with the base film BF directed upward and they are stacked by the same thermally stacking plate as that of the embodiment 1 and the base film BF is peeled by the same adsorption plate as that of the first embodiment likewise. The thermal stacking and the peel of the films are sequentially repeated until the predetermined number of the green sheets GS without the through holes SH and the conductor patterns DP are stacked.

Next, the stacked member on the table 14 is cut to the dimensions corresponding to the respective components and the binder is removed from the multilayer chips having been cut at 500° C. under air atmosphere and further fired at about 900° C. under air atmosphere. After the firing, conductor paste for external electrodes is coated to the outside surface of each of the multilayer chips at the predetermined position thereof and re-fired at about 600° C. under air atmosphere. The manufacture of the multilayer chip inductors is finished by the above processes.

According to the aforesaid manufacturing method, although the conductor patterns DP are formed between the base film BF and the green sheet GS, the same functions and advantages as those of the first embodiment can be obtained.

Note, although the adsorption plate is exemplified as the film peeling means in the first embodiment and the second embodiment, a film peeling means having an adhesive rubber, resin or metal sheet swingably supported on the surface thereof, a film peeling means having an adhesive rubber, resin or metal roller rotatingly supported on the peripheral surface thereof, and the like may be used.

FIG. 17–FIG. 20 show a third embodiment to which the multilayer chip inductor according to the present invention is applied. A method of manufacturing the multilayer chip inductor according to the third embodiment will be described below with reference to the figures.

First, a green sheet GS is formed by coating ceramic slurry prepared by mixing ceramic slurry prepared by mixing binder and solvent with Ni-Zn-Cu ferrite powder on a band-shaped base film BF of about 100 μm thick composed of PET or the like to a thickness of abut 50 μm. The slurry coating apparatus shown in FIG. 2 is used to form the green sheet GS.

Next, about 50 μm diameter through holes SH as many as components to be obtained are formed to the green sheet GS in a predetermined disposition. The through holes are formed using the laser processing apparatus shown in FIG. 4.

Figure 17:
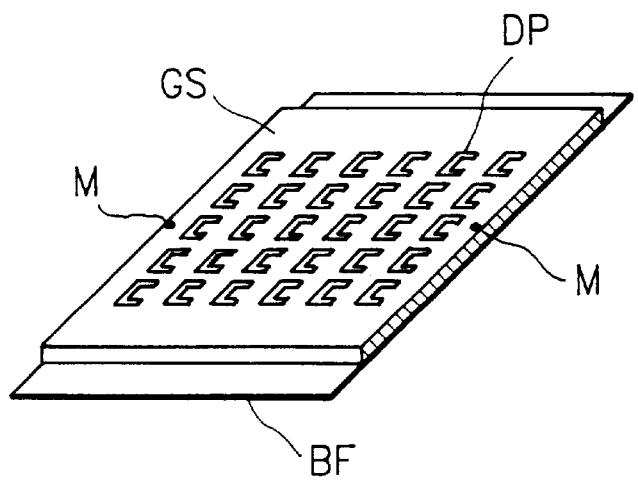
FIG. 17 is a perspective view showing the state that conductor patterns are formed to a green sheet to which through holes have been formed.

Next, conductor paste prepared by mixing binder and solvent with Ag powder is printed onto the green sheet GS to a thickness of about 30 μm to thereby form coil conductor patterns DP as many as the components to be obtained in a predetermined disposition (refer to FIG. 17). The screen printer shown in FIG. 6 is used to form the conductor patterns DP. Further, positioning marks M are simultaneously formed by the conductor paste at the predetermined positions of the green sheet GS in the screen printing as shown in FIG. 17.

Figure 18:
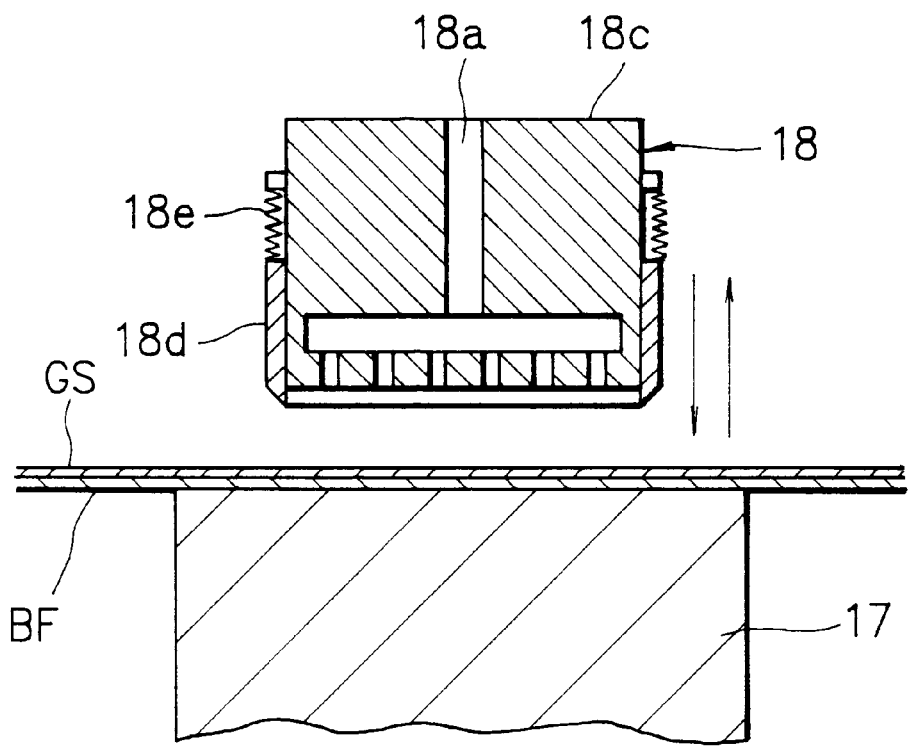
FIG. 18 is a view showing an arrangement of a cutting head.

Next, the green sheet is cut, peeled and stacked using a cutting head 18 as shown in FIG. 18. The cutting head 18 is composed of a head main body 18c having a suction path 18a therein and a multiplicity of suction holes 18b formed to the lower surface thereof, a square-cylindrical cutting blade 18d disposed externally of the head main body 18c so as to move upward and downward, and a spring member 18e for urging the cutting blade 18d downward. The cutting head 18 can move upward and downward in cutting operation, move for transportation and adsorb a sheet on the lower surface of the head main body 18c.

Figure 19:
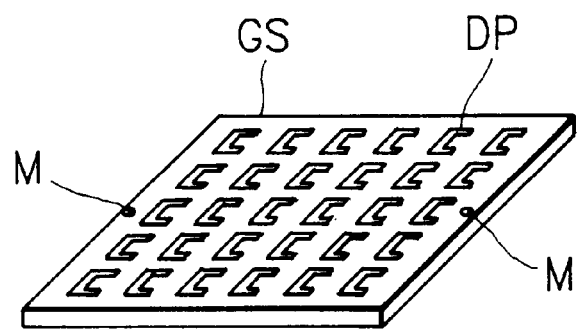
FIG. 19 is a perspective view of a green sheet cut and peeled by the cutting head.

First, as shown in FIG. 18, the green sheet GS with the base film BF shown in FIG. 17 is fed onto the table 17 with the green sheet GS directed upward and the cutting head 18 is positioned using the marks M sensed by a visual sensor or the like as references. Then, the cutting head 18 is lowered and cuts the green sheet GS to a predetermined size as well as adsorbs the cut green sheet GS by the lower surface of the head main body 18c and peels it from the base film BF by the upward movement of the cutting head 18. The green sheet having been cut and peeled is as shown in FIG. 19 and the marks M remain to the rectangular green sheet GS.

The cutting head 18 having adsorbed the cut and peeled green sheet GS is moved and stopped above another table 19 and lowered to place the green sheet GS on the table 19 and then the cutting head 18 having released the adsorption of the sheet is raised. Since the table 19 is provided with a means for securing the lowermost green sheet GS to the table side such as, for example, air suction holes, an adhesive tape or the like, the green sheet GS released from the adsorption remains on the table 19.

Subsequently, a green sheet GS with a base film BF is fed onto the table 17 with the green sheet GS directed upward as well as the cutting head 18 is returned above the table 17 and positioned using the marks M of the second green sheet GS as the references and then the green sheet GS is cut to a predetermined size by lowering the cutting head 18. Then, the cut green sheet GS is adsorbed by the lower surface of the head main body 18c and peeled from the base film BF by the upward movement of the cutting head 18.

Figure 20:
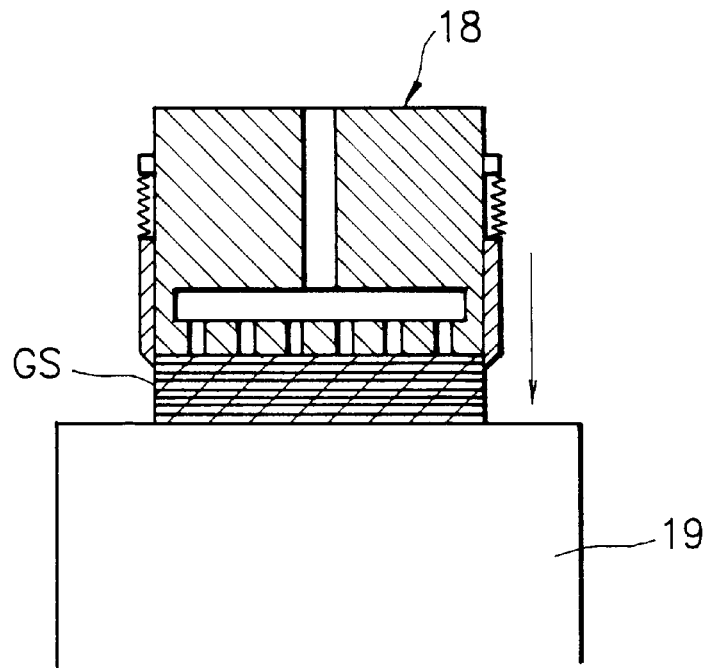
FIG. 20 is a view showing a green sheet stacking procedure.

Then, as shown in FIG. 20, the cutting head 18 having adsorbed the cut and peeled green sheet GS is moved and stopped above the table 19 and positioned using the marks M sensed by a visual sensor or the like, then the green sheet GS is stacked to the first green sheet GS by the downward movement of the cutting head 18 and the cutting head 18 is raised by releasing the adsorption of the sheet. Since the sticking force between the green sheet GS and the cutting head 18 is smaller than the sticking force between the stacked green sheets GS, the stacked green sheets GS are not pulled by the cutting head 18 when it is raised.

The above cut, peel and stacking of the sheets are carried out until the predetermined number of the green sheets GS are stacked on the table 19. Thereafter, the stacked member on the table 19 is pressed or thermally pressed again when necessary and subjected to the process for cutting it to dimensions as large as corresponding components, the process for firing the multilayer chips having been cut, the process for coating conductor paste serving as external electrodes to the predetermined locations of the multilayer chips having been re-fired the paste, and the like to thereby finish the manufacture of the multilayer chip inductor.

According to the aforesaid manufacturing method, since the through holes and the conductor patterns DP are formed to the green sheet GS on the base film BS and then the green sheet GS is cut to the predetermined dimensions and peeled and the peeled green sheet GS is transported while it is adsorbed by the cutting head 18 and multilayer, the number of transportation of the sheets is reduced as compared with that in the conventional method, the deformation such as a wrinkle, collapse of a shape and the like caused during the transportation of the sheet can be avoided to thereby prevent an increase of trouble and dispersion of electrical properties can be prevented, thus the multilayer chip inductor can be properly and stably manufactured.

Further, since the cutting process and the peeling process are carried out by the cutting head 18 provided with the suction means, the number of trouble for job is reduced as compared with the case in which the respective processes are carried out using separate devices, whereby productivity of the multilayer chip inductor can be greatly improved.

Since the positioning marks M for the processes to be effected later are formed to the green sheet GS when the conductor patterns DP are formed, the cutting, peeling and stacking processes to be effected later can be accurately carried out using the marks M as the references, so that failure caused by the dislocation of a cutting position, a stacking position and the like can be securely prevented.

Since the through hole forming process is carried out by the irradiation of the laser beam, the holes serving as the through hole can be accurately formed only to the green sheet GS without damaging the base film BS, thus the problem that the conductor patterns are abnormally connected to each other which may be caused by a poor through hole shape can be reliably prevented.

Note, the procedure for sequentially stacking the green sheets to which the through holes and the conductor patterns are formed is described in the aforesaid embodiment. However, when green sheets to which only the conductor patterns are formed are stacked, the stacking process is carried out after the execution of the processes except the through hole forming process and when dummy sheets having no through holes and conductor pattern are stacked, the stacking process is carried out after the execution of the processes except the through hole forming process and the conductor pattern forming process.

Although the respective processes in the aforesaid embodiment are carried out in the separate tables, the through hole forming process, the conductor pattern forming process and the cutting and peeling process may be carried out on the same table.

Although the positioning marks are formed to the green sheet when the conductor patterns are formed in the aforesaid embodiment, if marks used for positioning holes and the like are formed to the green sheet by the irradiation of the laser beam simultaneously with the formation of the through holes, the conductor pattern forming, cutting, peeling, and stacking processes can be accurately carried out using the marks as the references.

Figure 21:
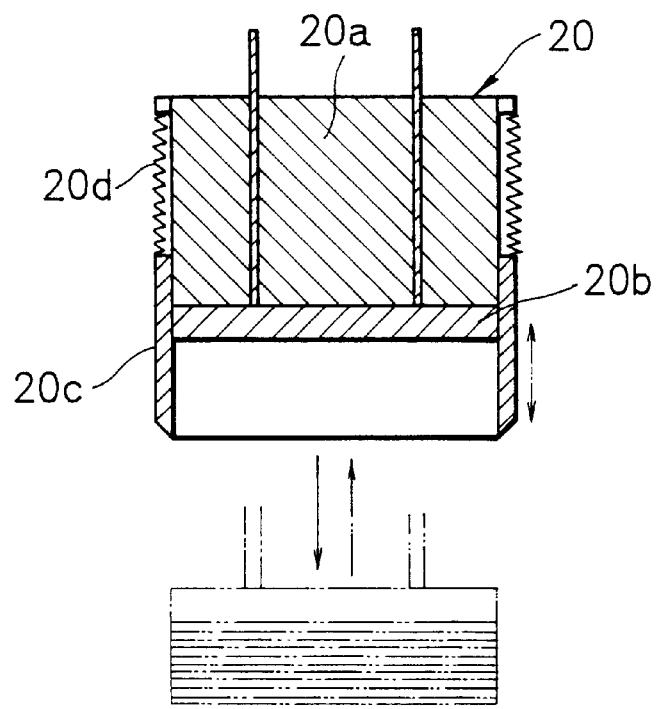
FIG. 21 is a view showing an arrangement of the cutting head.

Further, although the green sheets having been cut and peeled are transported to the stacking table and stacked thereon in the aforesaid embodiment, when the cutting head 20 shown in FIG. 21 is used, the number of trouble can be further reduced by carrying out stacking in the cutting head 20 likewise.

The cutting head 20 is composed of a head main body 20a, an upward/downward movable push plate 20b located on the lower surface of the head main body 20a, a square-cylindrical cutting blade 20c upward/downward movably disposed externally of the head main body 20a and the push plate 20b, and a spring member 20d for urging the cutting blade 20c downward. The cutting head 20 can move upward and downward in cutting operation and move for transportation as well as sequentially accommodate and stack green sheets having been cut. and suitably push out a stacked member by the downward movement of the push plate 20b.

FIG. 22–FIG. 26 shows a fourth embodiment in which the present invention is applied to a multilayer chip inductor. A method of manufacturing the multilayer chip inductor according to the fourth embodiment will be described below with reference to the figures.

First, a first transfer film F1 composed of a base film BF having a green sheet GS formed on a surface thereof is made by coating ceramic slurry prepared by mixing binder and solvent with Ni-Zn-Cu ferrite powder on the band-shaped base film BF of 100 $\mu$m thick composed of PET or the like to a thickness of abut 50 $\mu$m. The slurry coating apparatus shown in FIG. 2 is used to form the green sheet GS.

Next, conductor paste prepared by mixing binder and solvent with Ag powder is coated onto a band-shaped base film BF of 100 $\mu$pm composed of PET or the like to a thickness of about 30 $\mu$m to thereby form a second transfer film F2 having a conductor layer D formed on a surface of the base film BF. The slurry coating apparatus shown in FIG. 2 is used to form the conductor layer D.

Next, a third transfer film F3 is made by forming about 50 $\mu$m diameter through holes as many as components to be obtained to the green sheet GS of the first transfer film F1 in a predetermined disposition. The laser processing apparatus shown in FIG. 4 is used to form the through holes.

Figure 22:
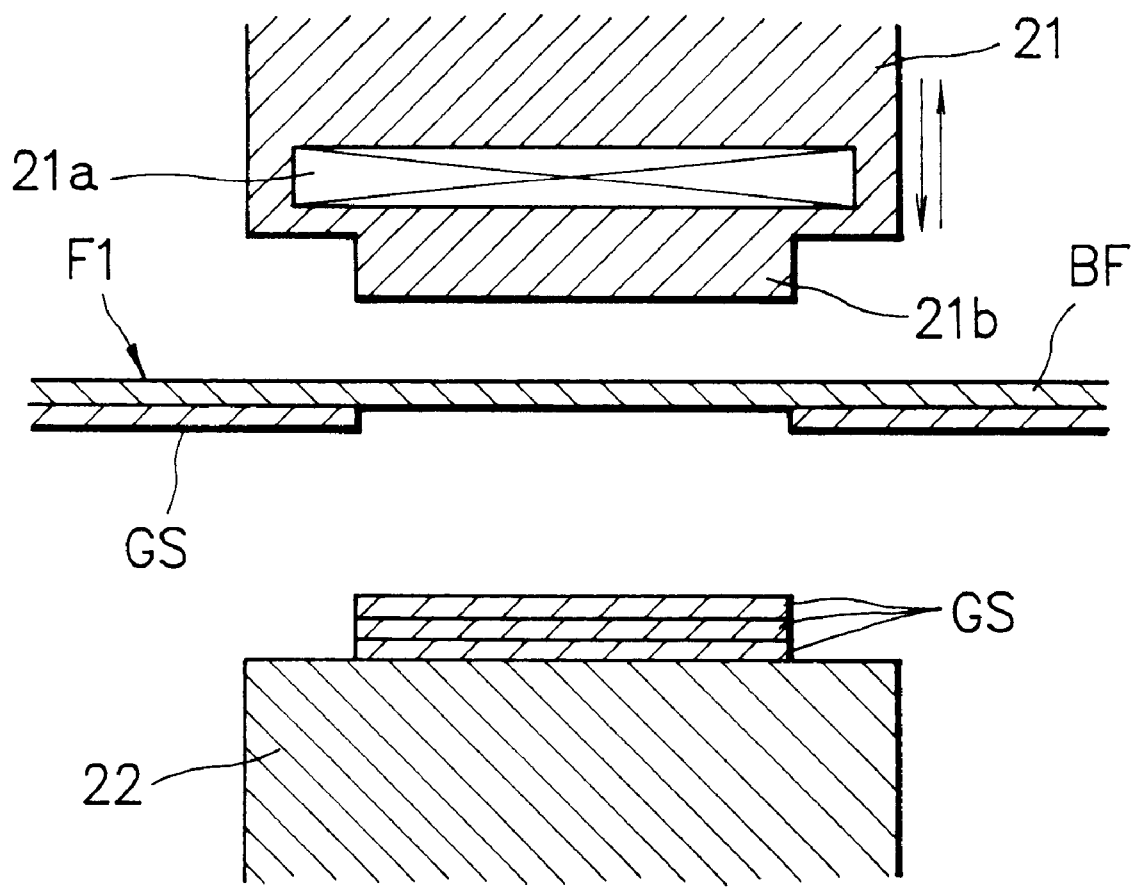
FIG. 22 is a view showing a green sheet transferring procedure.

Next, the green sheet is thermally transferred from the first transfer film F1 using a first thermal head 21 similar to that shown in FIG. 22. The first thermal head 21 contains a heater 21a and a rectangular transfer projection 21b corresponding to a transfer shape disposed on the lower surface thereof. Note, it is preferable that the first thermal head 21 is supported by a constant pressure mechanism composed of, for example, a spring member or the like to prevent the green sheet GS and the like from being deformed by an excessive pressure in the thermal transfer process.

That is, as shown in FIG. 22, the first transfer film F1 is fed between the table 22 and the first thermal head 21 with the green sheet GS directed downward and the first thermal head 21 is lowered in this state. With this operation, the first transfer film F1 is lowered together with the first thermal head 21 and a portion of the green sheet GS corresponding to the transfer projection 21b is softened by being heated and transferred onto the table 22 in a predetermined sheet shape. The thermal transfer of the green sheet GS is repeated until the predetermined number of green sheets GS are stacked.

Figure 23:
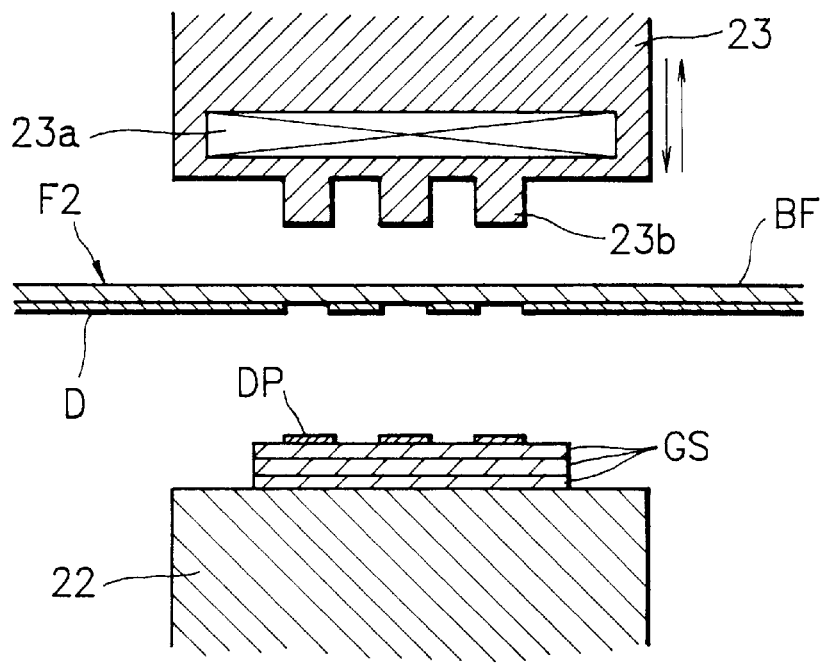
FIG. 23 is a view showing a conductor pattern transferring procedure.

Next, conductor patterns are thermally transferred from the second transfer film F2 using a second thermal head 23 as shown in FIG. 23. The second thermal head 23 contains a heater 23a and includes C-shaped or L-shaped transfer projections 23b disposed on the lower surface thereof. Note, it is preferable that the second thermal head 23 is.supported by a constant pressure mechanism composed of, for example, a spring member or the like to prevent the green sheet GS and the like from being deformed by an excessive pressure in the thermal transfer process.

That is, as shown in FIG. 23, the second transfer film F2 is fed between the stacked green sheet GS and the second thermal head 23 with the conductor layer D thereof directed downward and the second thermal head 23 is lowered in this state. With this operation, the second transfer film F2 is lowered together with the second thermal head 23 and a portion of the conductor layer D corresponding to the transfer projection 23b is softened by being heated and transferred onto the green sheet GS in a predetermined pattern shape (DP).

Next, a green sheet with through holes are thermally transferred from the third transfer film F3 using-the first thermal head 21 similar to that of FIG. 22.

Figure 24:
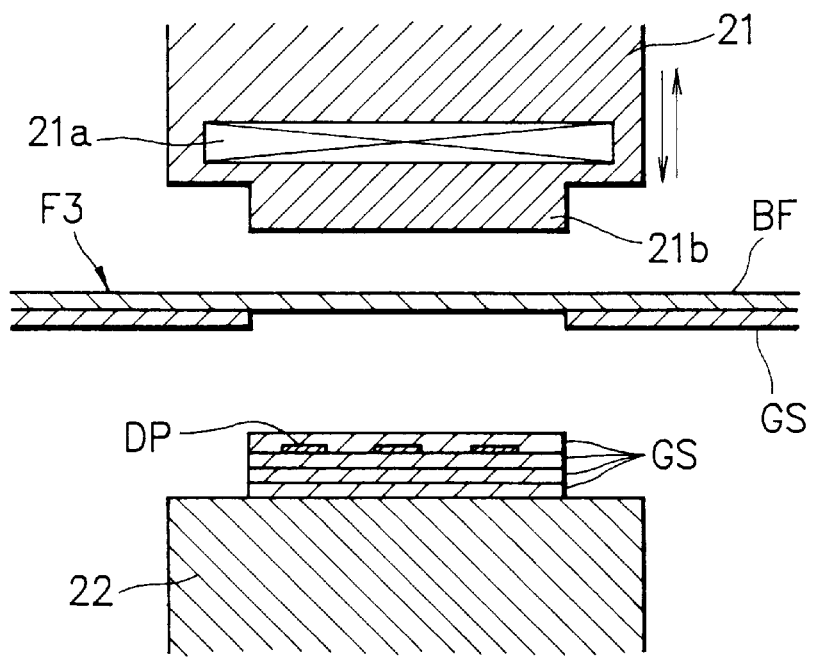
FIG. 24 is a view showing a green sheet with through holes transferring procedure.

That is, as shown in FIG. 24, the third transfer film F3 is fed between the green sheet GS to which the conductor patterns DP have been transferred and the first thermal head 21 with the green sheet GS thereof directed downward and the first thermal head 21 is lowered in this state. With this operation, the third transfer film F3 is lowered together with the first thermal head 21 and a portion of the green sheet GS corresponding to the transfer projection 21b is softened by being heated and transferred onto the green sheet GS to which the conductor patterns DP have been transferred in a predetermined sheet shape.

Note, the conductor patterns DP are aligned with the through holes in the transfer process by controlling the position where the third transfer film F3 is fed using positioning marks formed simultaneously with the formation of the through holes as references.

The transfer of the conductor pattern from the second transfer film F2 and the transfer of the green sheet with the through holes from the third transfer film F3 are sequentially repeated until the predetermined number of green sheets GS are stacked through the conductor patterns DP, in other words, until predetermined coil pattern is obtained by the conductor patterns DP.

Figure 25:
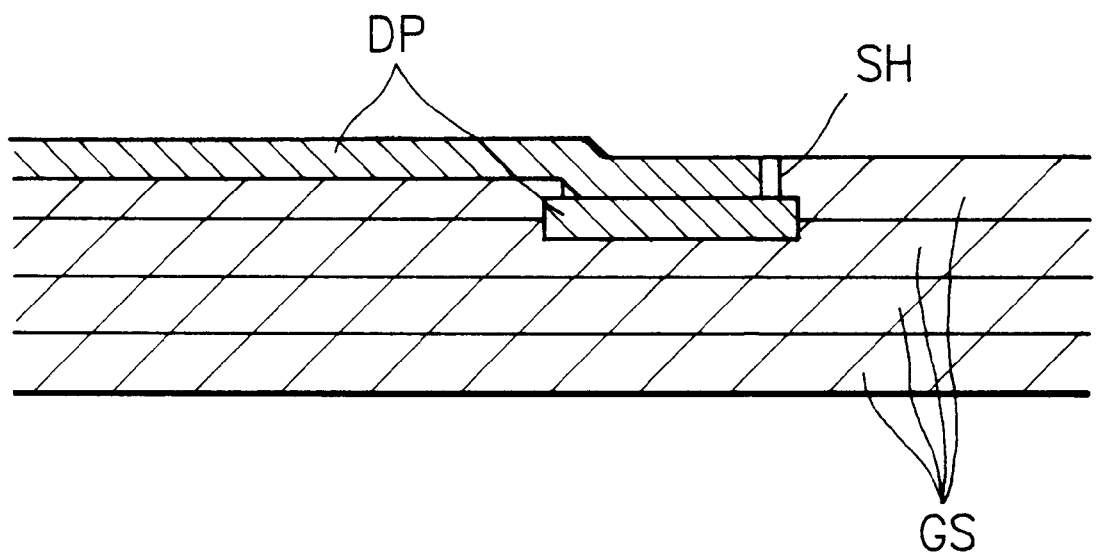
FIG. 25 is a cross-sectional view of the portion of a green sheet to which a conductor pattern is transferred.

As shown in FIG. 25, the connection terminal of the conductor pattern DP transferred from the second transfer film F2 to the green sheet GS with the through holes is pushed into the through hole SH simultaneously with the transfer, so that the conductor pattern DP comes into direct contact with the conductor pattern DP locating thereunder through the through hole SH.

Figure 26:
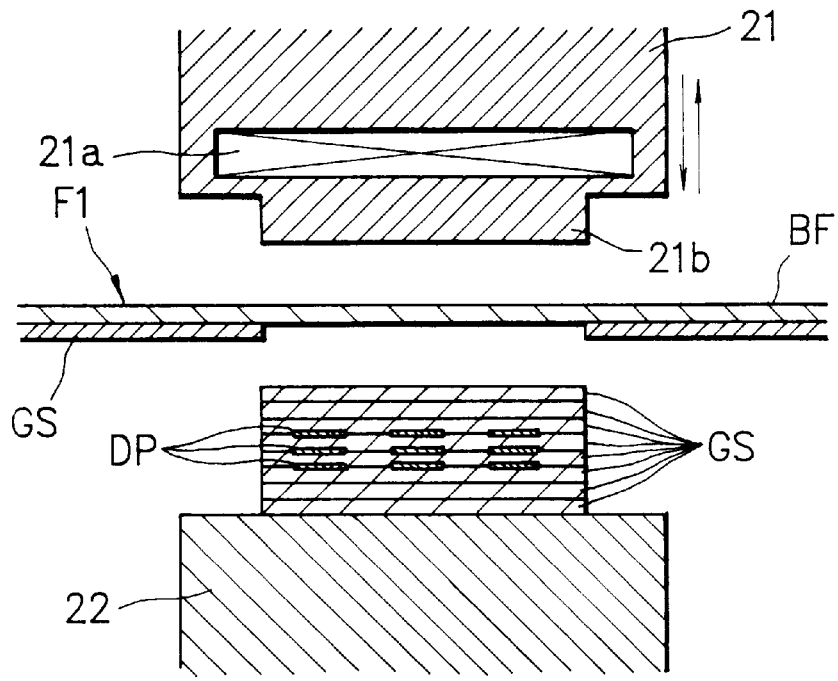
FIG. 26 is a view showing a green sheet transferring procedure.

Next, as shown in FIG. 26, the first transfer film F1 is fed between the stacked green sheet GS and the first thermal head 21 with the green sheet GS thereof directed upward and the first thermal head 21 is lowered in this state. With this operation, the first transfer film F1 is lowered together with the first thermal head 21 and a portion of the green sheet GS corresponding to the transfer projection 21b is softened by being heated and transferred onto the green sheet GS in a predetermined sheet shape. The thermal transfer of the green sheet GS is repeated until the predetermined number of green sheets GS are multilayer.

Thereafter, the stacked member on the table 22 is pressed or thermally pressed again to be identical construction when necessary and subjected to the process for cutting it to dimensions as large as corresponding components, the process for firing the multilayer chips having been cut, the process for coating conductor paste serving as external electrodes to the predetermined locations of the multilayer chips having been re-fired the paste, and the like likewise the first embodiment likewise the first embodiment to thereby finish the manufacture of the multilayer chip inductor.

According to the aforesaid embodiment, since the conductor layer D formed to the second transfer film F2 is thermally transferred onto the green sheet GS while it is stacked in the predetermined pattern shape, the invasion of the conductor into the pin holes and cuts can be suppressed even if they are formed to the green sheet GS, so that failures such as change of inductance, short circuit and the like can be securely prevented.

Moreover, since almost no solvent is contained in the transferred conductor patterns DP, the problem of sheet attack and deformation in firing caused by the penetration of the solvent can be prevented before they arise, so that positional accuracy of the conductor patterns DP as well as the relative accuracy between the conductor patterns DP and the through holes SH can be improved.

Since the green sheet GS provided with each of the first transfer film F1 and the third transfer film F3 is thermally transferred to the predetermined sheet shape making use of the first thermal head 21 and the green sheets GS and the green sheet GS with the through holes are stacked by the predetermined sequence, the thickness of the green sheet GS as a whole can be reduced, whereby a small multilayer chip inductor of excellent quality can be obtained.

Further, since the through holes are formed to the green sheet GS of the third transfer film F3 by irradiating the laser beam, the holes serving as the through holes SH can be accurately formed only to the green sheet Gs without damaging the base film BF for supporting the green sheet GS, thus the problem of the abnormal connection between the conductor patterns caused by the poor shape of the through holes SH can be securely prevented.

Figure 27:
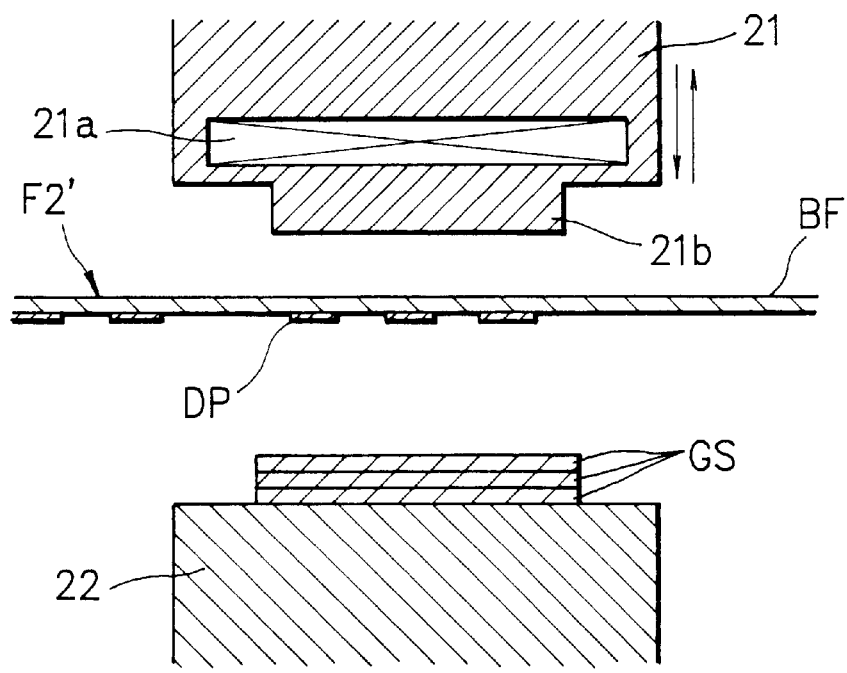
FIG. 27 is a view showing a conductor pattern transferring procedure.

Note, although the aforesaid embodiment shows the second transfer film F2 composed of the base film BF having the conductor layer D formed to the surface thereof, a base film BF having only conductor patterns DP with a predetermined shape to be transferred formed thereto may be used as a second transfer film F2' as shown in FIG. 27. The screen printer shown in FIG. 6 is used to form the conductor patterns DP and the first thermal head 21 is also used for the thermal transfer of the conductor patterns DP.

Although the aforesaid embodiment shows that the conductor layer D and the conductor patterns DP are formed to the base film BF by a thick film method, they may be formed by a thin film methods such as evaporation, sputtering and the like and the adhering force of the conductor layer and the conductor patterns may be suitably adjusted by previously applying a separating agent such as silicone or the like to a base film. The thermal transfer can be also effected in this case by the same procedure as that of the above embodiment as well as there can be achieved an advantage that the multilayer chip inductor can be miniaturized because thinner conductor patterns can be transferred.

Further, although the aforesaid embodiment shows that the green sheet GS provided with each of the first transfer film F1 and the third transfer film F3 is thermally transferred to the predetermined sheet shape making use of the first thermal head 21, the green sheets GS may be stacked in such a manner that each green sheet GS is punched to a predetermined sheet shape together with the base film BF and the punched green sheet is attached to a lower sheet under pressure and then the base film BS is peeled.

Figure 28:
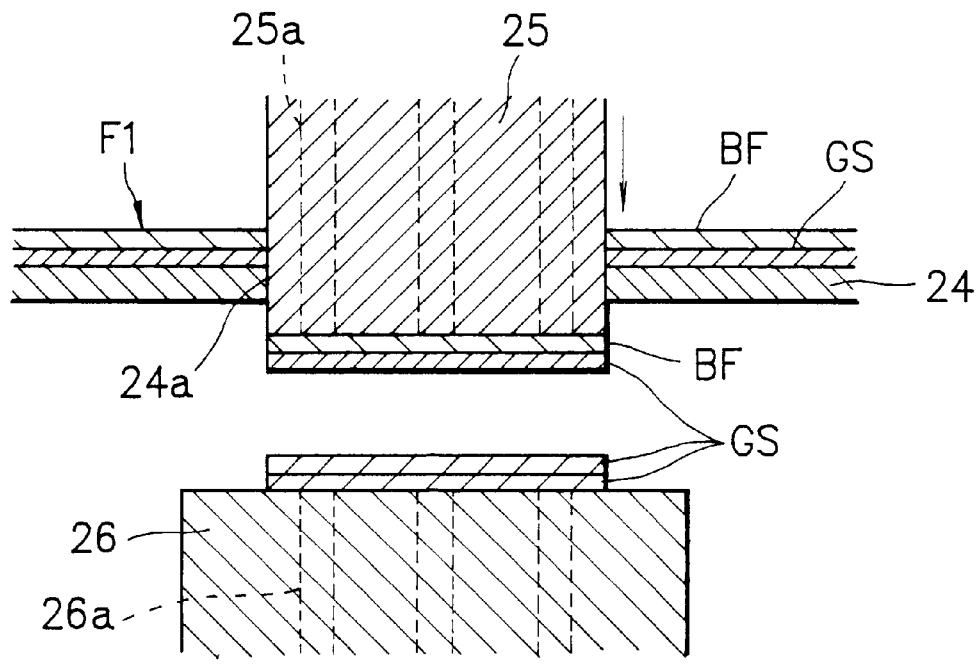
FIG. 28 is a view showing a green sheet stacking procedure.
Figure 29:
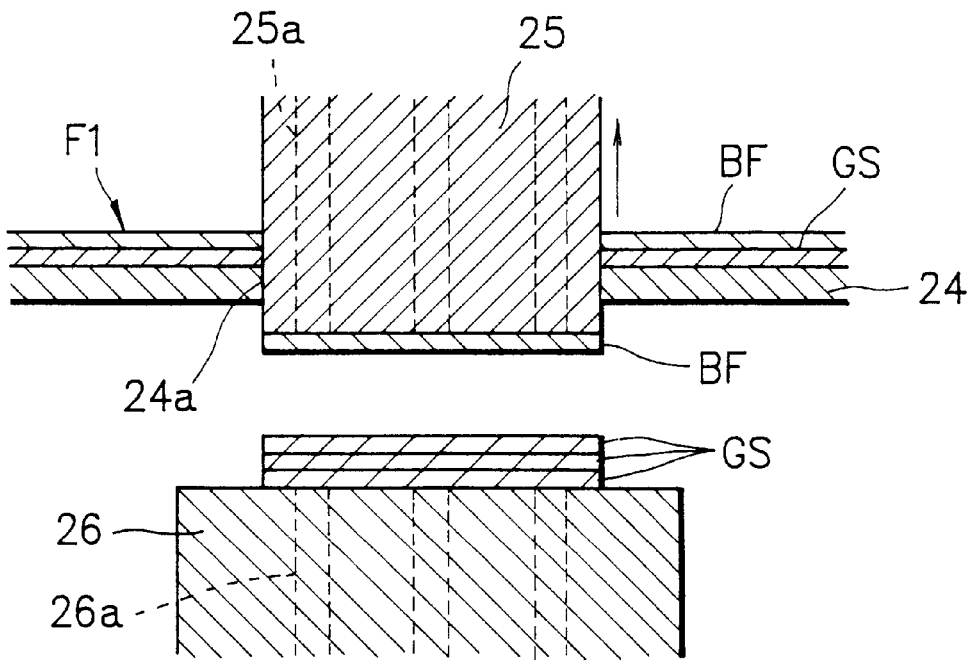
FIG. 29 is a view showing a base film peeling procedure.

More specifically, as shown in FIG. 28, there are prepared a mold plate 24 having a punch hole 24a corresponding to a sheet shape, a punch 25 with a suction hole 25a corresponding to the sheet shape and a table 26 with suction holes 26a, the first transfer film F1 or the third transfer film F3 is fed onto the mold plate 24 with the green sheet GS directed downward, then the green sheet GS is punched to the predetermined sheet shape together with the base film BF by lowering the punch 25 and pushed against the table 26 or the green sheet GS locating thereunder in an adsorbed state and then raised. As a result, only the base film BF can be peeled from the stacked green sheet GS as shown in FIG. 29 and the green sheets can be stacked in a predetermined sequence likewise the above embodiment by repeating the stacking and peel while replacing the transferred film fed onto the mold plate 24.

As can be understood from the first to fourth embodiments, the present invention is characterized in that through holes are formed to a green sheet by irradiating a laser beam. Specific apparatuses and methods for the purpose will be introduced below.

Figure 30:
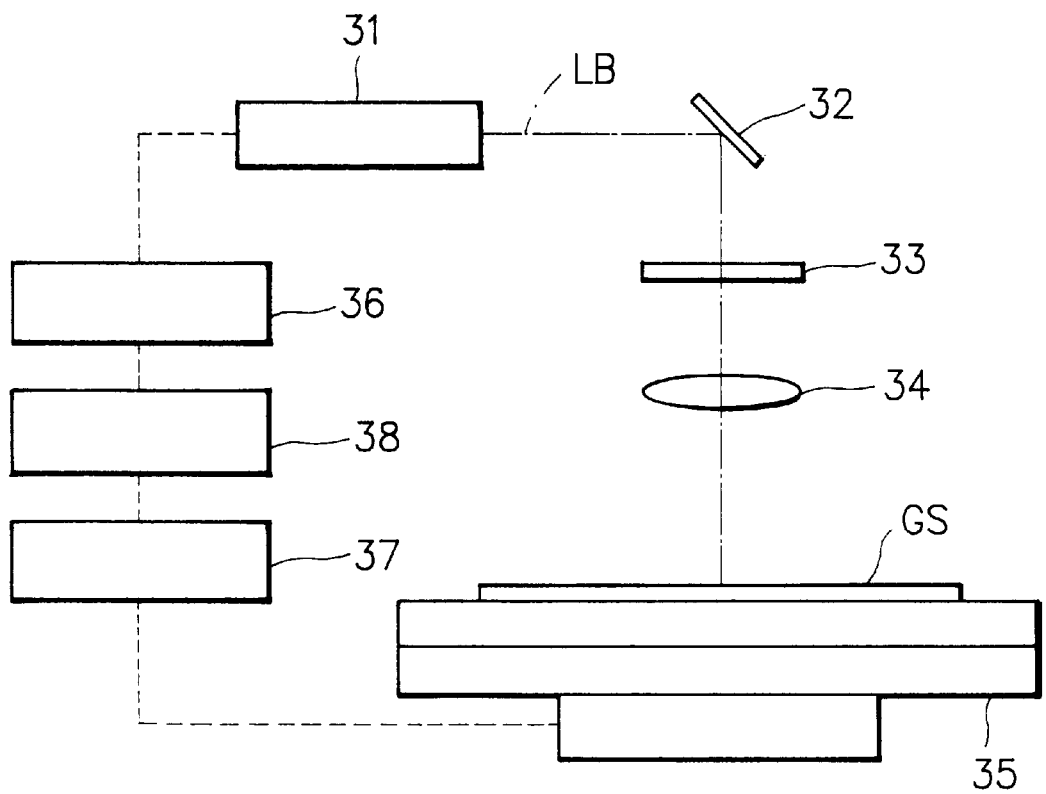
FIG. 30 is a view showing an arrangement of the laser processing apparatus.

FIG. 30 shows a laser processing apparatus for forming through holes to a green sheet. In the figure, numeral 31 denotes a laser oscillator, symbol LB denotes a laser beam, numeral 32 denotes a mirror, numeral 33 denotes a mask, numeral 34 denotes an image-forming lens, numeral 35 denotes an XY table, symbol GS denotes a green sheet, numeral 36 denotes a laser drive circuit, numeral 37 denotes a table drive circuit, numeral 38 denotes a control circuit containing a processing control program and composed of a microcomputer.

Figure 31:
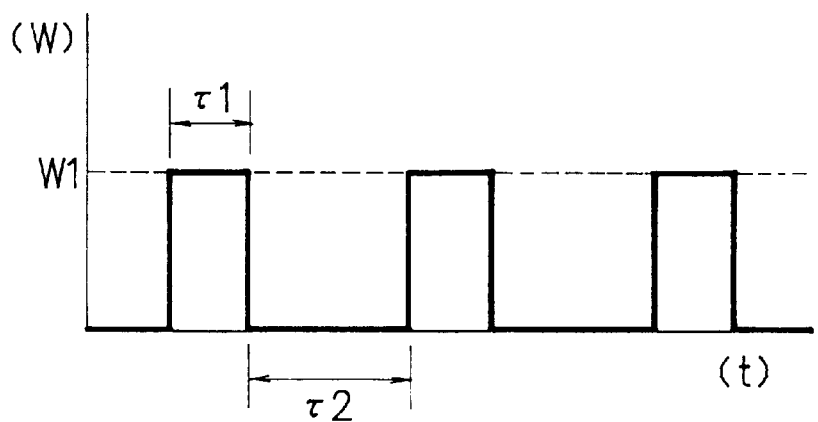
FIG. 31 is a graph showing a laser oscillating form.

The laser oscillator 31 is composed of a YAG laser, oscillates normal pulses as shown in FIG. 31 in response to a drive signal from the laser drive circuit 36 and generates the laser beam LB having a peak value of W1 by the oscillation. The pulse duration $\tau 1$ of the laser beam LB is an order of $\mu s$ or ms and suitably selected depending upon the thickness, material and the like of the sheet GS to be handled.

Figure 32:
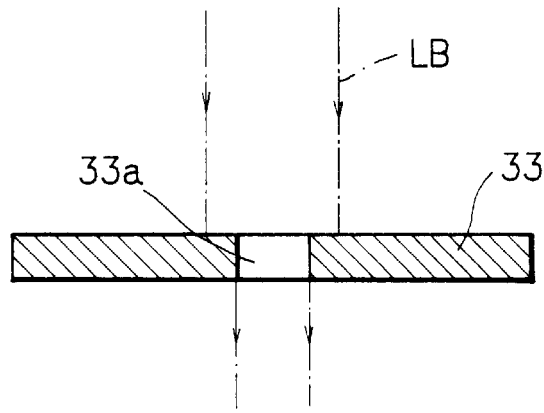
FIG. 32 is a view showing how a laser beam passes through a mask.

The mask 33 is composed of a glass sheet and includes a light transmitting portion 33a corresponding to a through hole such as, for example, a transparent or semi-transparent portion, a hole or the like which permits the transmission of right rays as shown in FIG. 32. As shown by the dot-dash line in the figure, the laser beam LB irradiated to the mask 33 has a diameter larger than the light transmitting portion 33a and only the laser beam LB having passed through the light transmitting portion 33a is incident on the lens 34. Although the light transmitting portion 33a is fundamentally formed to a shape similar to a through hole intended to be formed, the shape of the light transmitting portion 33a may be determined based on the shape of the beam actually irradiated to the sheet GS.

As shown by the dot-dash-line of FIG. 30, the processing apparatus is arranged such that the laser beam LB generated from the laser oscillator 31 can be reflected by the mirror 32 and irradiated to the mask 33 and the laser beam LB having passed through the light transmitting portion 33a of the mask 33 can be converged by the lens 34 and irradiated to green sheet GS at a predetermined image-forming ratio, and the magnitude of the irradiated shape can be suitably adjusted by the position of the lens. Note, the mirror 32 shown in the figure can be eliminated by changing the direction of the laser oscillator 31.

Figure 33:
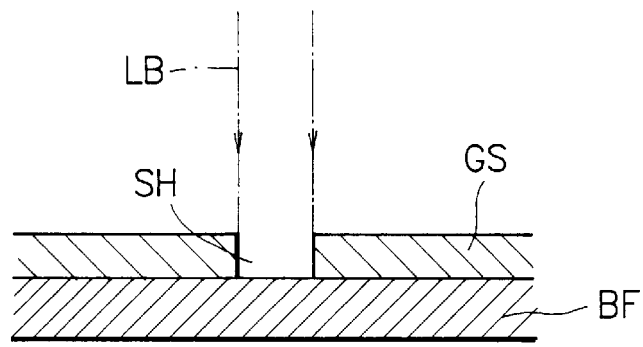
FIG. 33 shows the state that a laser beam is irradiated to a green sheet.

As shown in FIG. 33, the shape of the laser beam LB irradiated to the green sheet GS is made smaller than the shape of the light transmitting portion 33a of the mask 33 to increase an energy density and an intended through hole SH is formed by melting and vaporizing the portion of the green sheet GS to which the laser beam is irradiated. Although FIG. 4 shows the green sheet GS supported by the base film BF, a hole can be formed only to the green sheet GS without damaging the film BF locating thereunder by suitably adjusting the output energy density of the laser beam LB.

The XY table 35 supports the green sheet GS on a plane perpendicular to the optical axis of the irradiated laser beam and can move the green sheet GS in X- and Y-directions in response to a drive signal from the table drive circuit 37. The XY table 35 includes motors and position detectors corresponding to the X- and Y-directions and the table moving position thereof is controlled by a closed loop by the table drive circuit 37.

A method of forming a through hole by the laser processing apparatus will be described with reference to FIG. 34 and FIG. 35.

First, the green sheet GS is transported making use of an adsorption head or the like and placed on the XY table 35 in a predetermined direction (in the direction where the X and Y-axes of the XY table 35 are in parallel with the two sides of the green sheet GS).

Figure 35:
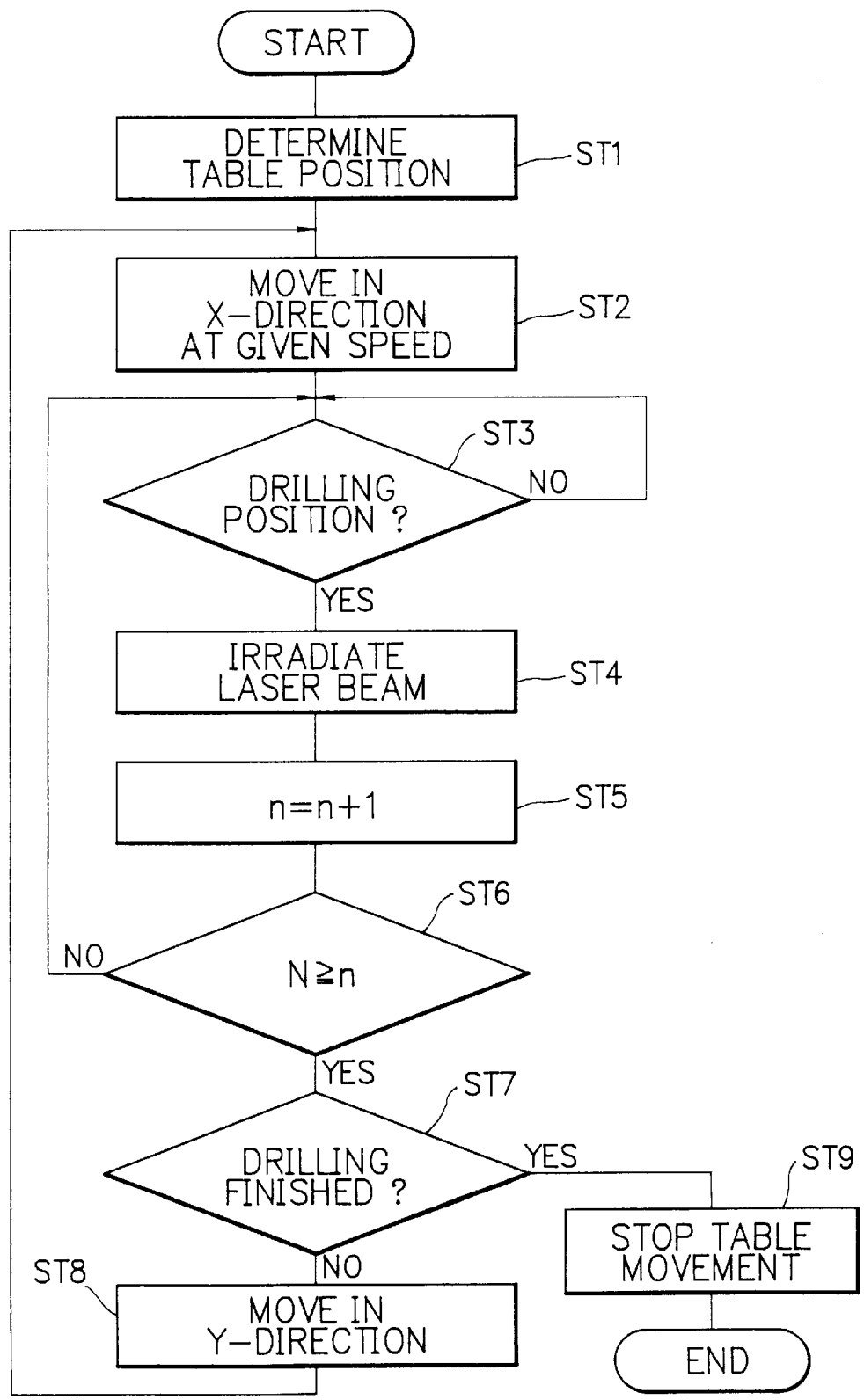
FIG. 35 is a processing control flowchart.

After the green sheet GS is placed, the XY table 35 is suitably moved to determine a position where a job starts (step ST1 in FIG. 35). The positioning is effected by sensing a side or an angle of the green sheet GS and moving the XY table 35 so that the predetermined portion of the green sheet GS is positioned below the optical axis of the irradiated beam. When a correction in a θ direction is necessary in the positioning, it suffices only to use an XYθ table capable of making displacement in the direction.

Figure 34:
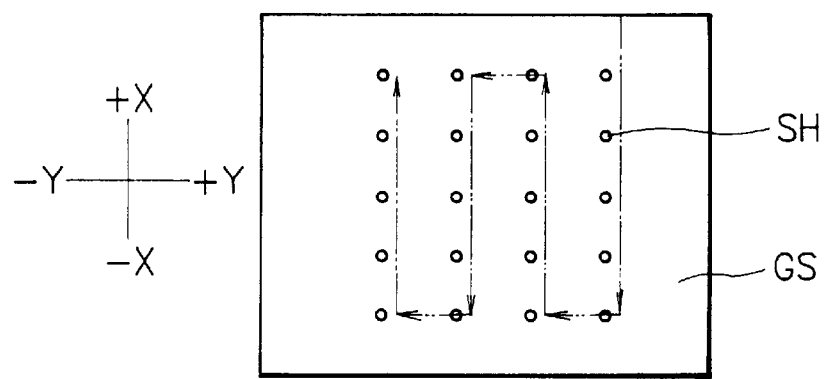
FIG. 34 is a view showing a through hole forming step.

After the positioning, the green sheet GS is moved in a +X direction in FIG. 34 at a given speed (step ST2 of FIG. 35) and when the position where a first hole is to be formed is reached by the amount of movement thereof in the direction, a shot of the normal pulse laser beam LB is irradiated to the green sheet GS being moved to thereby form a through hole SH to the green sheet GS (steps ST3, ST4 of FIG. 35). Thereafter, one shot of the laser beam LB is irradiated to the green sheet each time it is moved by a predetermined amount to thereby form N pieces (5 pieces in the drawing) of the through holes SH in the X-direction of the green sheet GS (steps ST5, ST6 of FIG. 35).

After the N pieces of the through holes SH are formed in the X-direction, the green sheet GS is moved from the positions of the through holes in the +Y-direction of FIG. 34 (step ST8 of FIG. 35) a predetermined distance and then the laser beam LB is intermittently irradiated while the green sheet is moved in a −X direction at a given speed to thereby form N pieces of through holes SH also in the direction. Then, the predetermined number (20 pieces in total) of through holes SH are formed to the green sheet GS along the path shown by the two-dot-and-dash-line in FIG. 34 by repeating the above procedure. It is needless to say that the moving path (=path along which the through holes SH are formed) of the green sheet GS is not limited to the meander path shown in the drawing but a path of any other shape may be employed.

After the predetermined number of the through hole SH are formed to the green sheet GS on the XY table 35, the movement of the table is stopped to thereby finish a series of the processings (steps ST7, ST9 of FIG. 35).

According to the aforesaid processing method, mechanical vibration and impact caused in a conventional processing are not applied to the green sheet GS and dislocation and deformation resulting from contact are not arisen to the green sheet GS. Thus, the drop of accuracy caused by them can be previously prevented, so that the intended through holes SH can be formed with a pinpoint accuracy of shape and a pinpoint positional accuracy.

When masks having light transmitting portions formed to different shapes and a mask having light transmitting portions formed to a plurality of shapes are prepared, various shapes of through holes can be formed by a single set of the apparatus, thus the apparatus is provided with very high versatility.

Since the irradiation of the laser beam and the formation of the through holes are effected instantly, the green sheet GS is not necessarily stopped each time the processing is carried out, thus the predetermined number of the through holes SH can be sequentially formed while the green sheet GS is continuously moved, whereby a processing efficiency can be improved and a processing time can be greatly reduced.

Even if the shape of the through hole SH is extended in the moving direction of the sheet by the relationship between the pulse duration τ1 of the laser beam LB and the moving speed of the sheet, this problem can be simply solved by correcting the size and shape of the light transmitting portion 33a along the sheet moving direction, in other words, by narrowing the shape of the irradiated laser beam in the sheet moving direction by the amount of the extension.

Since the laser beam LB is irradiated to the green sheet GS at the image-forming ratio by which the shape of the irradiated beam is made smaller than the shape of the light transmitting portion 33a of the mask 33, the processing can be effectively carried out by increasing the density of irradiated energy.

Further, when the pulse interval τ2 shown in FIG. 31 is preset in accordance with the moving time of the green sheet GS, the necessary number of the through holes SH can be formed only by oscillating the laser while the green sheet GS is moved at a given speed in a predetermined direction, whereby a load on the table side for position detection and drive control can be reduced to thereby ease control.

Figure 36:
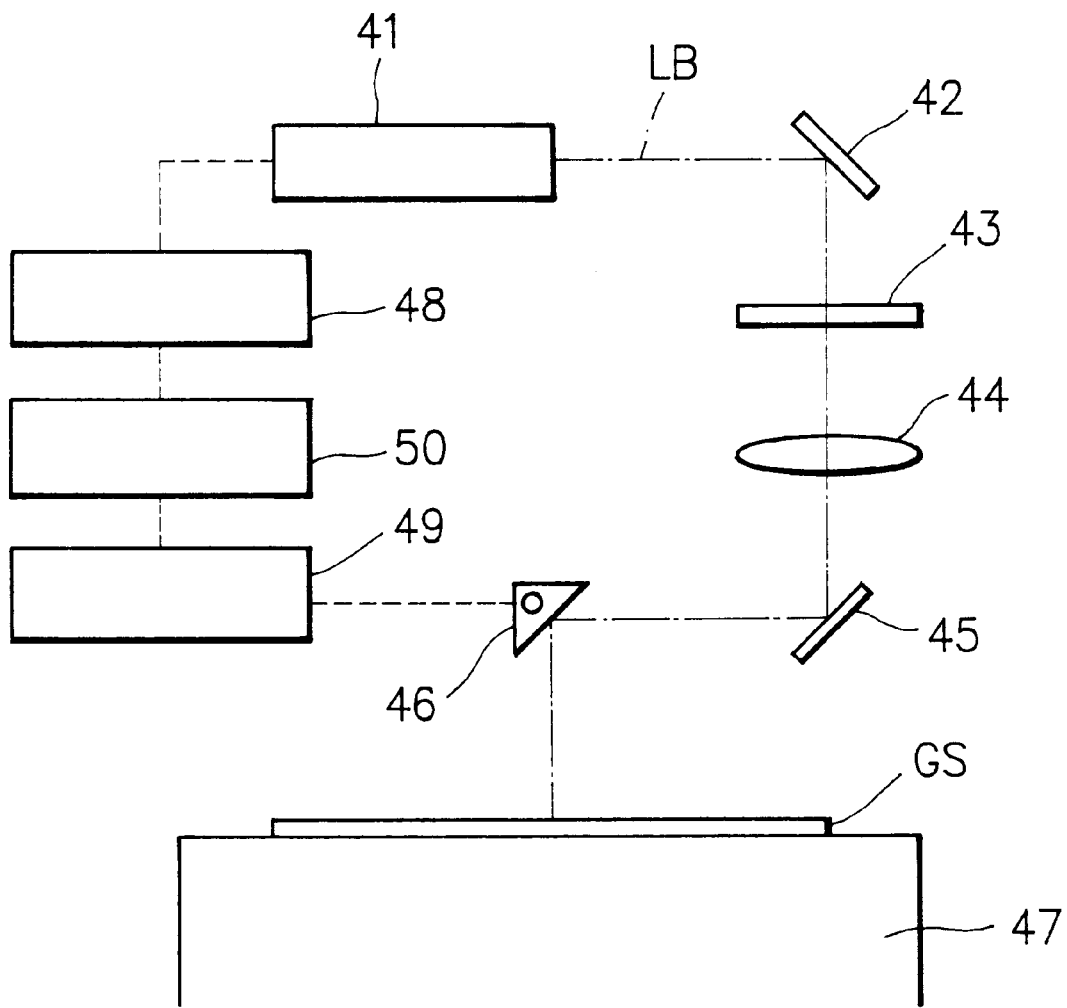
FIG. 36 is a view showing an arrangement of the laser processing apparatus.

FIG. 36 shows another laser processing apparatus for forming through holes. In the figure, numeral 41 denotes a laser oscillator, symbol LB denotes a laser beam, numeral 42 denotes a mirror, numeral 43 denotes a mask, numeral 44 denotes an image-forming lens, numeral 45 denotes-a mirror, numeral 46 denotes a galvano-mirror, numeral 47 denotes a table, symbol GS denotes a green sheet, numeral 48 denotes a laser drive circuit, numeral 49 denotes a mirror drive circuit, numeral 50 denotes a control circuit containing a processing control program and composed of a microcomputer. Note, the laser oscillator 41, the mask 43 and the laser drive circuit 48 are similar to those of the processing apparatus shown in FIG. 30.

As shown by the dot-dash-line of FIG. 36, the processing apparatus is arranged such that the laser beam LB generated from the laser oscillator 41 can be reflected by the mirror 42 and irradiated to the mask 43 and the laser beam LB having passed through the light transmitting portion of the mask 43 can be focussed by the lens 44, reflected by the mirror 45 and further reflected by the galvano-mirror 46 and irradiated to green sheet GS at a predetermined image-forming ratio, and the magnitude of the irradiated shape can be suitably adjusted by the position of the lens.

The shape of the laser beam LB irradiated to the green sheet GS is made smaller than the shape of the light transmitting portion of the mask 43 to increase an energy density likewise the laser processing apparatus shown in FIG. 30. Note, the mirrors 42, 45 shown in the figure can be eliminated by changing the direction of the laser oscillator 41 and the lens 44 may be interposed between the galvano-mirror 46 and the green sheet GS.

The galvano-mirror 46 has a degree of freedom of 2 and can suitably change the position of the green sheet GS where the laser beam is irradiated by changing the reflecting angle thereof in response to a drive signal from the drive circuit 49. The galvano-mirror 46 includes motors and position detectors corresponding to two directions perpendicular to each other and the reflection angle thereof is controlled by a closed loop by the drive circuit 49.

A through hole forming procedure effected by the processing apparatus will be described with reference to FIG. 37.

First, the green sheet GS is transported making use of an adsorption head or the like and placed on the table 47 in a predetermined direction (direction corresponding to the direction in which the galvano-mirror 46 is changed).

Figure 37:
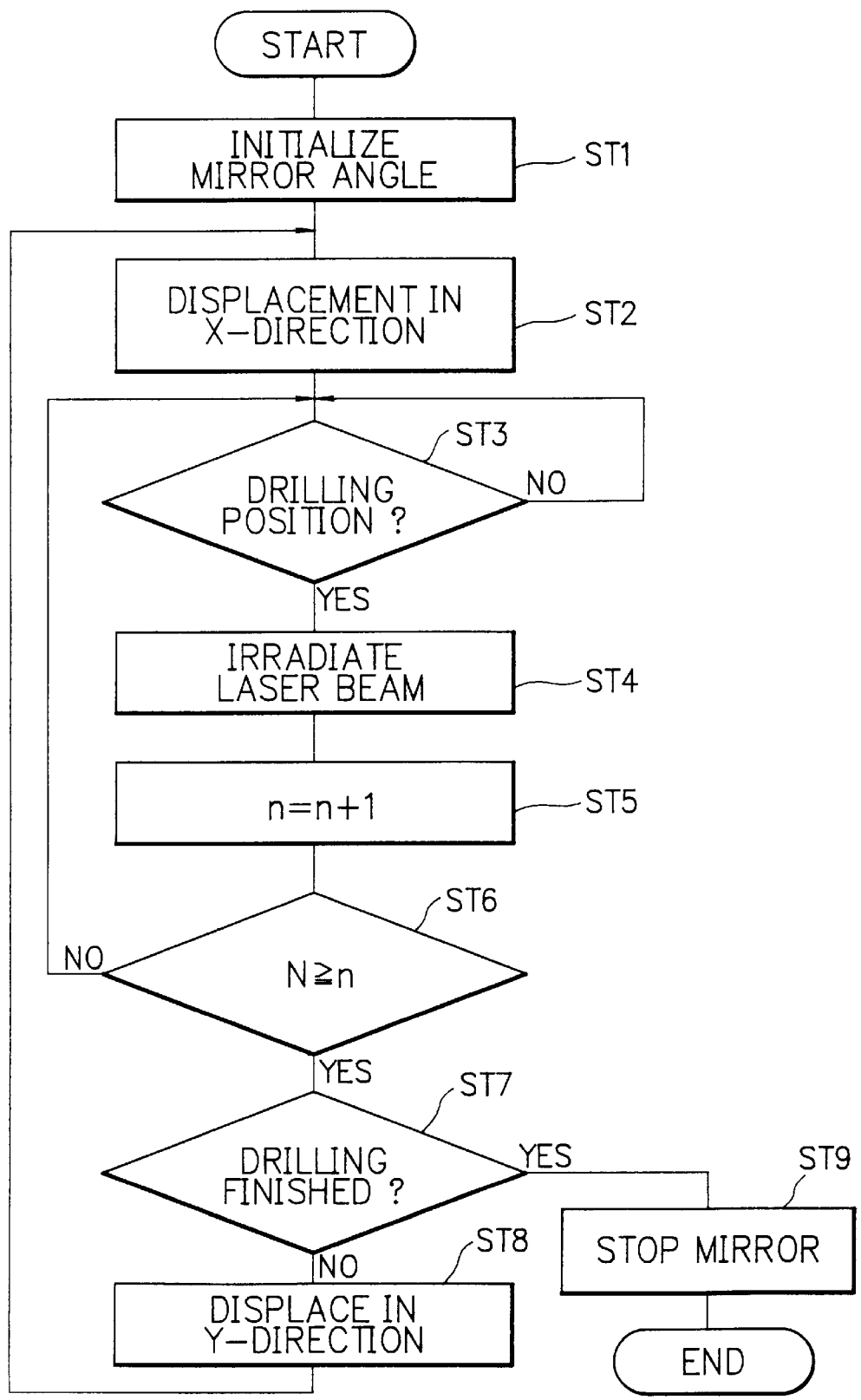
FIG. 37 is a processing control flowchart.

After the green sheet.GS is placed, the galvano-mirror 46 is suitably moved to thereby initialize a reflection angle for determining a job start position (step ST1 of FIG. 37). The initialization may be effected by a method of generating a weakly output laser beam and irradiating the beam vertically and sensing the beam on the table side or the like in addition to a method of effecting the initialization based on previously input data.

After the initialization, the reflecting angle of the galvano-mirror 46 is displaced at a given speed so that a laser beam irradiated position is changed to the −X direction in FIG. 34 (step ST2 of FIG. 37) and one shot of the normal pulse laser beam LB is irradiated to the green sheet GS when a first hole forming position is reached by the amount of displacement in the direction to thereby form a through hole SH to the green sheet GS (steps ST3, ST4 of FIG. 37). Thereafter, one shot of the laser beam LB is intermittently irradiated each time a predetermined amount of displacement is made to thereby form N pieces of through holes SH to the green sheet GS in the X-direction thereof.

After the N pieces of the through holes SH are formed in the X-direction, the reflecting angle of the galvano-mirror 46 is displaced in the Y-direction so that the irradiating position of the laser beam is changed in the −Y-direction of FIG. 34 by a predetermined distance from the positions of the through holes (step ST8 of FIG. 37) and then the laser beam LB is intermittently irradiated while the reflecting angle of the galvano-mirror 46 is displaced at a given speed so that the irradiating position of the laser beam is changed in the +X direction of FIG. 34 to thereby form N pieces of through holes in the direction. Then, the above procedure is repeated to form the predetermined number of through holes SH along the path shown by the two-dot-and-dash-line of FIG. 34. It is needless to say that the direction in which the galvano-mirror 46 is replaced (=path along which the through holes SH are formed) is not limited to the direction in which the laser beam irradiating position meanders but any other shape of path may be formed in the direction.

After the predetermined number of the through holes SH are formed to the green sheet GS on the table 47, the displacement of the mirror is stopped to thereby finish a series of the processings (step ST7, ST9 of FIG. 37).

Even with the aforesaid processing method, intended through holes SH can be formed with a pinpoint accuracy of shape and a pinpoint positional accuracy likewise the processing method shown in FIG. 30.

Further, when masks having light transmitting portions formed to different shapes and a mask having light transmitting portions formed to a plurality of shapes are prepared, various shapes of through holes can be formed by a single set of the apparatus, thus the apparatus is provided with very high versatility.

Further, since the irradiation of the laser beam and the formation of the through holes are effected instantly, the galvano-mirror 46 is not necessarily stopped each time the processing is carried out, thus the predetermined number of the through holes SH can be sequentially formed while the reflecting angle of the mirror 46 is continuously changed, whereby a processing efficiency can be improved and a processing time can be greatly reduced.

Even if the shape of the through hole SH is extended in the moving direction of the sheet by the relationship between the pulse duration τ1 of the laser beam LB and the moving speed of the sheet, this problem can be simply solved by correcting the size and shape of the light transmitting portion along the sheet moving direction.

Since the laser beam LB is irradiated to the green sheet GS at the image-forming ratio by which the shape of the irradiated beam is made smaller than the shape of the light transmitting portion of the mask 33, the processing can be effectively carried out by increasing the density of irradiated energy.

Further, when the pulse interval τ2 shown in FIG. 31 is preset in accordance with the replacing time of the galvano-mirror 46, the necessary number of the through holes SH can be formed only by oscillating the laser while the reflecting angle of the galvano-mirror 46 is changed in a predetermined direction at a given speed, whereby a load on the mirror side for position detection and drive control can be reduced to thereby ease control.

Figure 38:
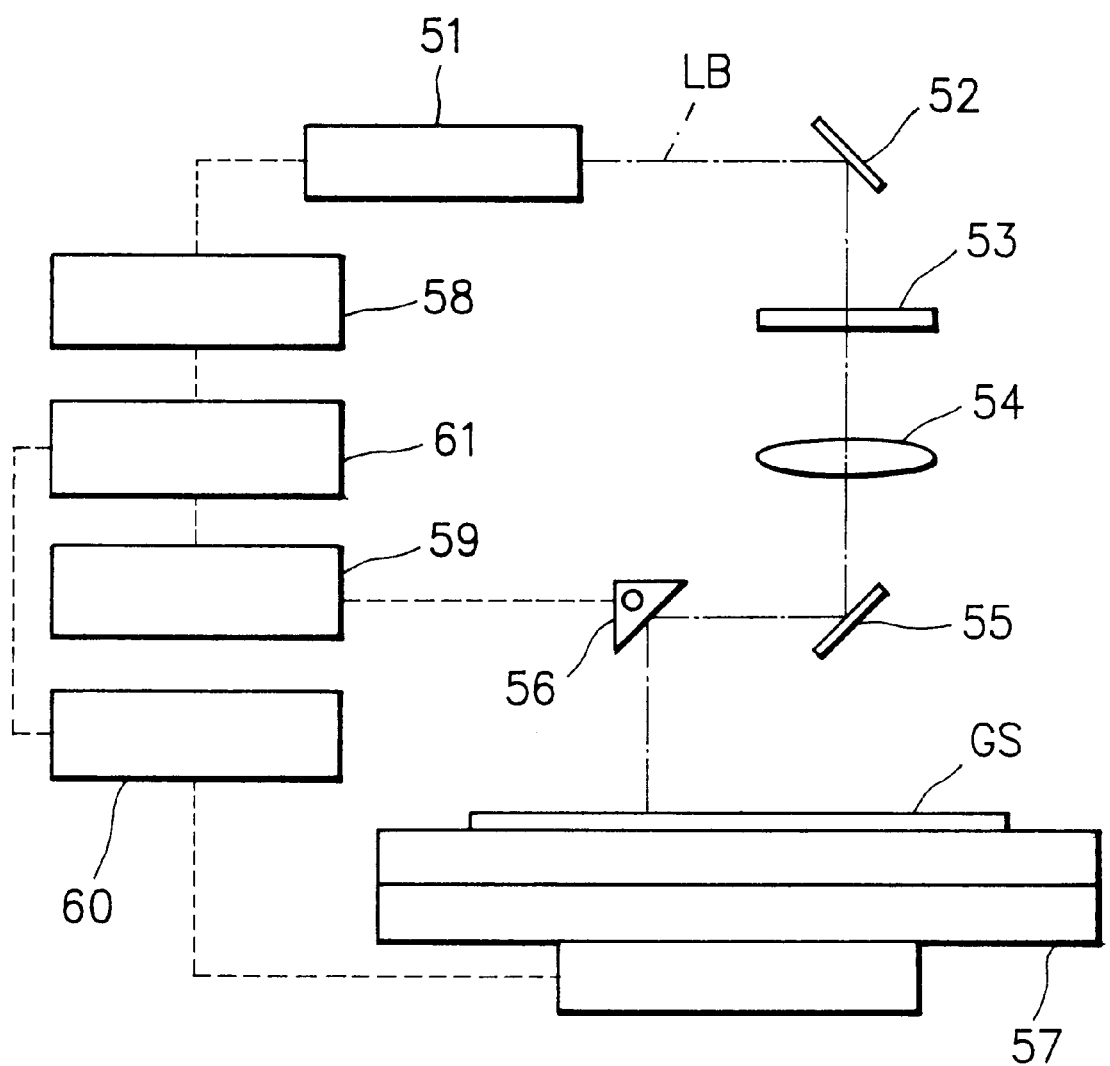
FIG. 38 is a view showing an arrangement of the laser processing apparatus.

FIG. 38 shows still another laser processing apparatus for forming through holes to a green sheet. In the figure, numeral 51 denotes a laser oscillator, symbol LB denotes a laser beam, numeral 52 denotes a mirror, numeral 53 denotes a mask, numeral 54 denotes an image-forming lens, numeral 55 denotes a mirror, numeral 56 denotes a galvano-mirror, numeral 57 denotes an XY table, symbol GS denotes a sheet, numeral 58 denotes a laser drive circuit, numeral 59 denotes a mirror drive circuit, numeral 60 denotes a table drive circuit, and numeral 60 denotes a control circuit containing a processing control program and composed of a microcomputer.

This processing apparatus is composed by the combination of the components of the processing apparatuses shown in FIG. 30 and FIG. 36, respectively, more specifically by using the XY table and the galvano-mirror in combination and can selectively executes the processing method executed by the processing apparatus of FIG. 30 and the processing method executed by the processing apparatus of FIG. 36.

Note, although the apparatuses of FIG. 30, FIG. 36 and FIG. 38 have the mask to which the single light transmitting portion is disposed, when a plurality of light transmitting portions are disposed to the mask and a plurality of laser beams are simultaneously irradiated from a plurality of lasers to the respective light transmitting portions, a plurality of laser beams can be simultaneously irradiated and through holes as many as the laser beams can be formed to the green sheet at the same time. Since this method can greatly reduce a processing time as compared with the method of forming the through hole one by one, it is very advantageous when through holes are formed to a green sheet where a lot of components must be mounted and through holes for a plurality of sheets are formed to a long sheet.

Figure 39:
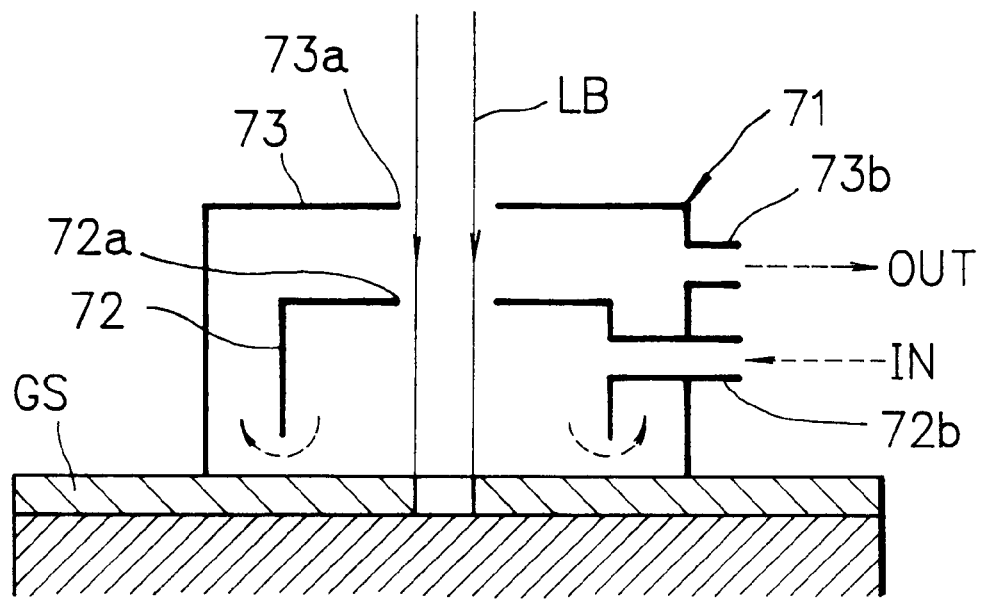
FIG. 39 is a view showing an arrangement of a suction cover.

Further, when through holes are formed by the irradiation of a laser beam, there arise problems that residuals resulting from a melted sheet material and floating substances are deposited to a sheet and through holes, a laser beam is scattered by the floating substances and the atmosphere in a working room such as a clean room and the like is polluted by the floating substances. In this case, it suffices only to cover the laser beam irradiated portion of the green sheet GS with a suction cover 71 as shown in FIG. 39.

The suction cover 71 is composed of an inner cover 72 having a laser beam passing through hole 72a on an upper surface and an air flowing-in port 72b on a side and an outer cover 73 having a laser beam passing through hole 73a on an upper surface and an air flowing-out port 73b on a side. When an air supply compressor is connected to the air flowing-in port 72b through a tube, an air exhaust compressor is connected to the air flowing-out port 73b through a tube and relationship $Q\alpha \leq Q\beta$ is established between an air flowing-in amount $Q\alpha$ and an air flowing-out amount $Q\beta$, the melted residuals and the floating substances made in the processing can be exhausted to the outside of the working room together with air.

Figure 40:
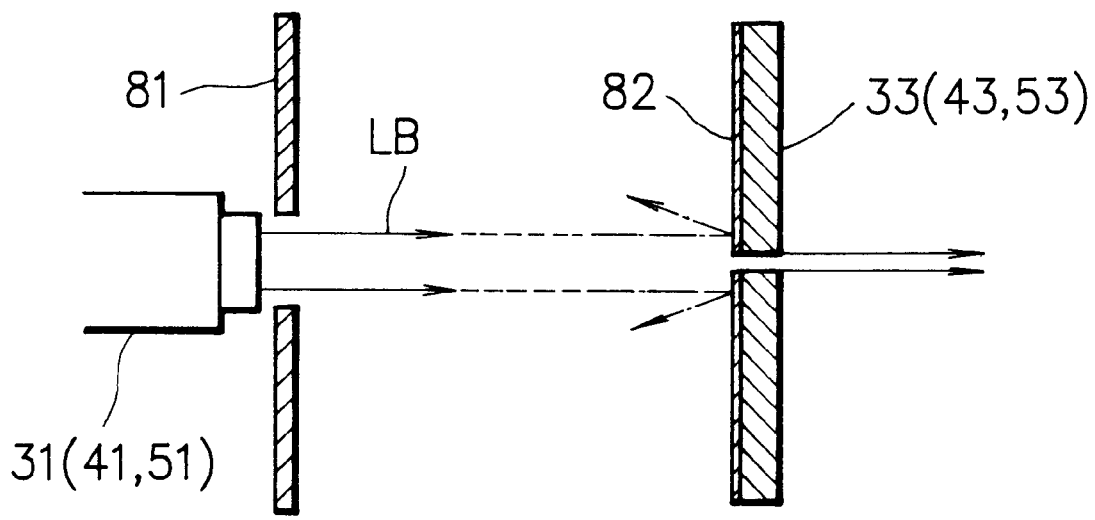
FIG. 40 is a view showing an arrangement of a shade sheet and a reflection layer.
Figure 41:
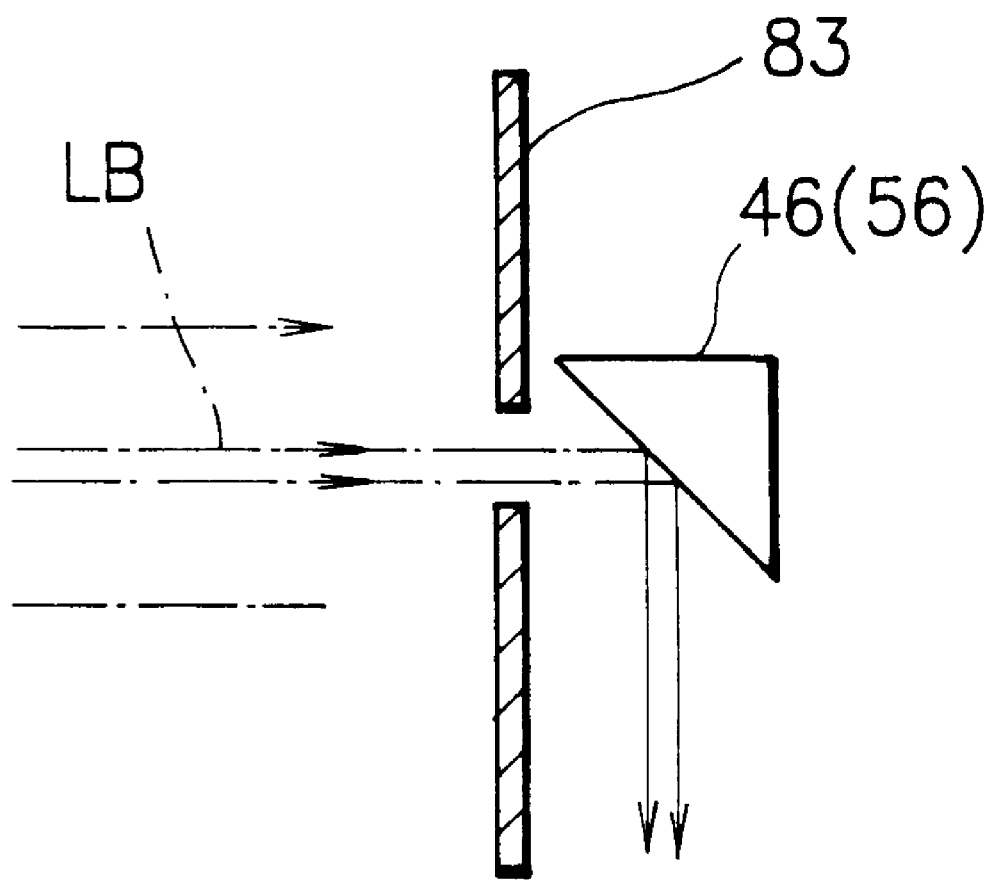
FIG. 41 is a view showing an arrangement of the shade sheet.

There is a possibility of occurrence of a problem that when the laser beam is irradiated from the laser to the mask, the laser beam not passing through the mask is partly reflected from the mask to the laser oscillator side to thereby increase a temperature and cause an optical interference. In this case, it is preferable to interpose a shade plate 81 which permits only the laser beam LB to pass therethrough between the laser oscillator 31 (41, 51) and the mask 33 (43, 53) to thereby shut off the reflected laser beam as shown in FIG. 40.

There is also a possibility that when the laser beam is irradiated from the laser to the mask, the laser beam is absorbed to the mask and increases the temperature thereof to thereby cause strain and the deformation of holes. In this case, it is preferable to form a reflection layer 82 composed of a metal sheet, a metal film or the like on the laser beam irradiated side of the mask 33 (43, 53) and positively reflect the not passing through laser beam as shown in FIG. 40 and in this case it is desirable to prevent the affect due to the reflected laser beam using the shade plate 81 together with the reflection layer 82. It is needless to say that the temperature increase of the mask is prevented by directly cooling the mask itself by an air blasting means or a water circulation means without providing the reflection layer or it is effective to provide a radiation means such as fins or the like with the mask.

Further, there is a possibility that the laser beam having passed through the mask is partially dispersed to the laser beam passing through side and the dispersed laser beam is irradiated and absorbed to the galvano-mirror to thereby increase the temperature of a galvano-mirror drive source, by which an irradiated position is dislocated from a correct position due to the change of a gain. In this case, it is preferable to dispose a shade plate 83 which permits only the laser beam LB to pass therethrough in front of the galvano-mirror 46 (56) and shut off a dispersed laser beam. Otherwise, the gain may be corrected in accordance with an actually detected temperature by previously measuring the change of the gain caused by the temperature increased.

The peak power W1 and the pulse duration $\tau 1$ of the laser beam LB shown in FIG. 31 will be supplementarily explained with reference to FIG. 42–FIG. 45. The following explanation will be made on the premise that the laser beam generated from the laser is directly irradiated to the green sheet for the purpose of the convenience of the explanation. In the above respective laser processing apparatuses, however, since the laser beam is partially removed by reflection and the like when it passes through the mask, an actual peak power W1 is determined by suitably increasing and correcting the removed amount of the laser beam.

When it is assumed that the mass of a sheet material corresponding to the volume of the through hole (the product of the thickness of the green sheet by the cross-sectional area of the through hole) is m, the specific heat of the sheet material before it is vaporized is Cv, a temperature change from a room temperature to a vaporizing temperature is $\Delta T$, and a vaporizing latent heat is Ev, a quantity of heat Qh needed when the through hole SH is formed to the green sheet GS, in other words, a quantity of heat Qh capable of melting and vaporizing the amount of the sheet material corresponding to the volume of the through hole SH is determined by the formula $Qh = m \cdot (Cv \cdot \Delta T + Ev)$.

On the other hand, since a quantity of heat Qr obtainable by one shot of the laser beam LB can be determined by the formula $Qr = W1 \times \tau 1$, fundamentally, the through hole SH can be formed to the green sheet GS without causing any poorly passed through hole, residuals and the like when the peak power W1 and the pulse duration $\tau 1$ are determined so that the former quantity of heat Qh is equal to the latter quantity of heat Qr by previously calculating the quantity of heat Qh.

Figure 42:
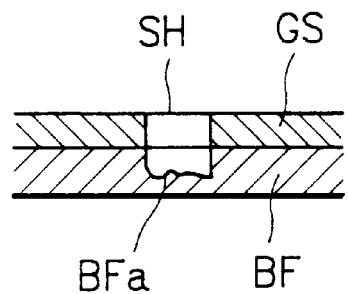
FIG. 42 is a view showing how a through hole is formed by a laser beam.
Figure 43:
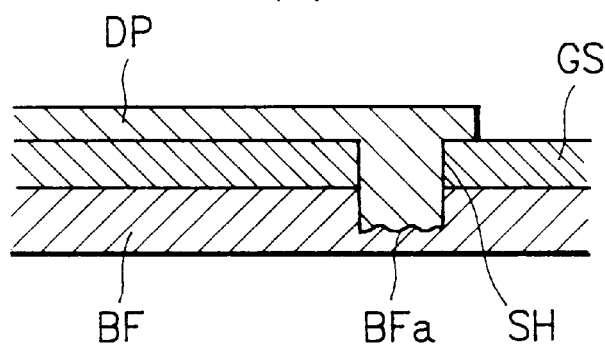
FIG. 43 is a view showing how a conductor pattern is formed and how a green sheet is peeled from a base film.
Figure 43:
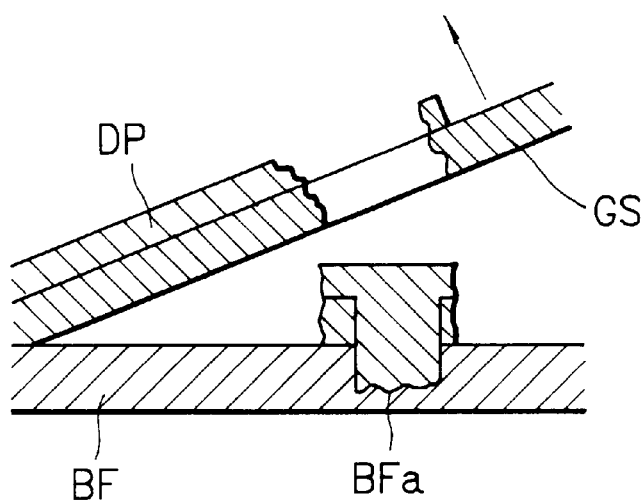

However, it is not sufficient that the values of the W1 and $\tau 1$ are determined so that the product thereof is equal to the above quantity of heat Qh. That is, when the value W1 is extremely small and the value of $\tau 1$ is increased accordingly, the temperature T of the base film BF is greatly increased and reaches a melting temperature Tm, thus a damage BFa such as an irregular portion, recess and the like are formed to the base film BF as shown in FIG. 42.

If the damage BFa is made to the base film BF, when the conductor paste serving as the conductor patterns DP is printed on the green sheet GS, not only the through hole SH but also the portion of the damage BFa of the base film BF are filled with the conductor paste (refer to FIG. 43(a)). As a result, when the green sheet GS is peeled from the base film BF, the paste filled in the through hole SH is almost left to the base film BF side and damages the fragile green sheet GS or the amount of the paste in the through hole SH is reduced and the conductor patterns DP cannot be satisfactorily connected to each other (refer to FIG. 43(b)).

Figure 44:
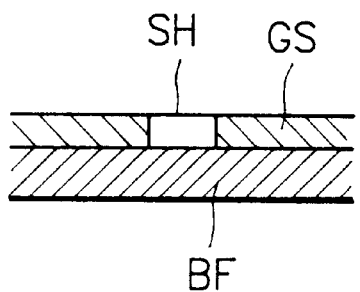
FIG. 44 is a view showing how a through hole is formed by a laser beam.
Figure 45:
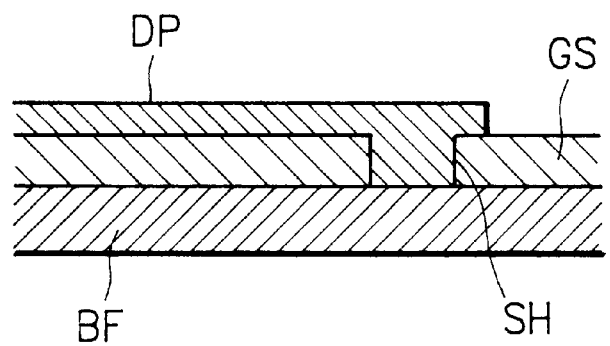
FIG. 45 is a view showing how a conductor pattern is formed and how a green sheet is peeled from a base film.
Figure 45:
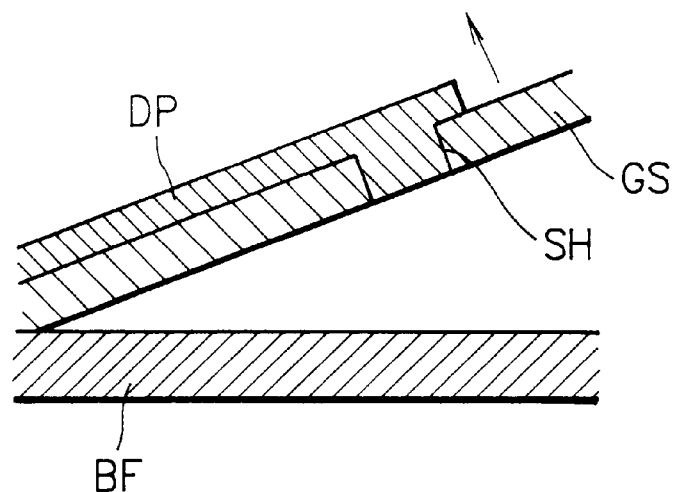

Although the proper values W1 and $\tau 1$ can be selected by repeating experiments while changing the respective values, when the value $\tau 1$ is restricted so that the irradiation of the laser beam is completed before the temperature T of the base film BF reaches the melting temperature Tm, an intended through hole SH can be accurately formed to the green sheet GS without causing damages such as the irregular portion, recess and the like to the base film BF as shown in FIG. 44.

When there is no such damage in the base film BF, the through hole SH can be properly filled with the conductor paste when the conductor patterns DP are formed (refer to FIG. 45(a)), thus when the green sheet GS can be peeled from the base film BF well without damaging the green sheet GS and remaining no paste (refer to FIG. 45(b)).

Figure 46:
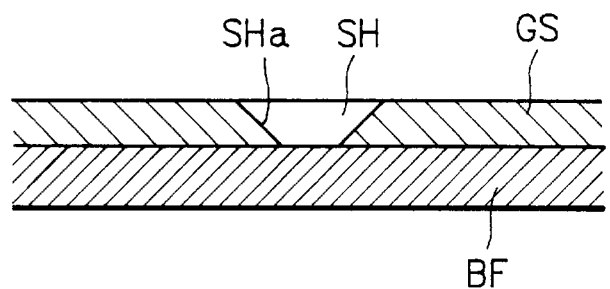
FIG. 46 is a view showing an example of the configuration of a through hole.

Note, to reduce the force for drawing the filled paste when the base film BF is peeled, it suffices only to make the cross-sectional area of the through hole smaller toward the lower portion thereof to thereby make the opening area of the through hole on the base film side smaller than that of the other side. For example, a resistance against the drawing force can be increased by providing a taper SHa to the inner surface of the through hole SH and forming the through hole SH to an inverted frustum of circular cone as shown in FIG. 46.

Figure 47:
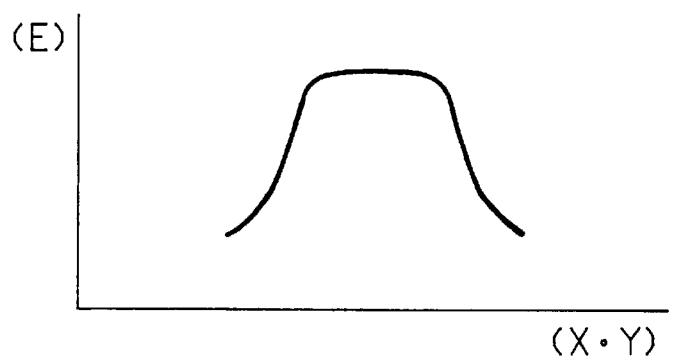
FIG. 47 is a graph showing the distribution of energy of a laser beam.

To form such a through hole SH, it is preferable to cause the laser beam LB irradiated to the green sheet GS to achieve an energy distribution as shown in FIG. 47. That is, it is preferable to make the energy value on the outer peripheral portion of the laser beam smaller than that at the center thereof to thereby suppress the melt and vaporization of the inner peripheral portion of the through hole. Methods of realizing the above includes the formation of an irregular portion to the inner peripheral surface of a hole when the light transmitting portion of the mask is composed of the hole, the formation of a gradation such as, for example, the change of a material, the irregular portion on a surface or the like to the outer periphery of the light transmitting portion to suppress the excessive pass of the laser beam therethrough when the light transmitting portion is transparent or semi-transparent, and the like.

Figure 48:
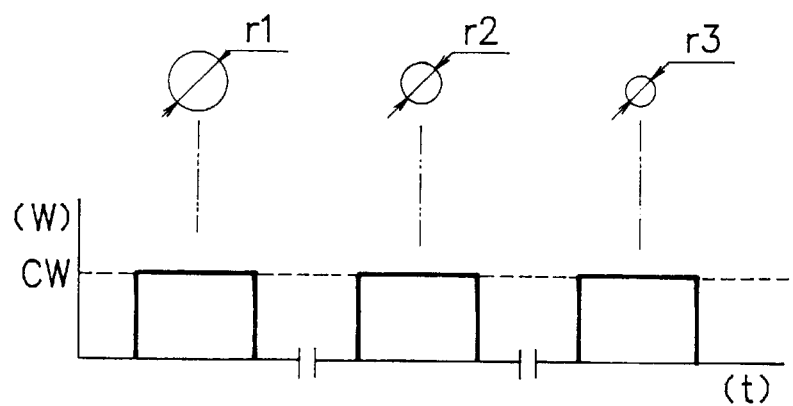
FIG. 48 is a view showing a method of irradiating a laser beam.

Further, when one through hole SH is formed by a plurality of shots of the laser beam, the cross-sectional area of the through hole can be reduced toward the downward direction thereof by preparing a plurality of masks having different hole diameters r1, r2, r3 and gradually reducing the diameter of the through hole every shot of the beam as shown in FIG. 48 or gradually reducing the irradiated shape of the laser beam every shot of the beam by changing the image-forming ratio of the laser beam depending upon the position of the lens.

Although the above-described first to third embodiments show the conductor patterns formed on the surface of the green sheet, when grooves for accommodating the conductor patterns are formed on the surface of the green sheet and the conductor patterns are formed in the grooves, the projecting height of the conductor patterns can be lowered by the depth of the grooves, thus the size of components can be reduced. Some specific examples of the above arrangement will be described below.

Figure 49:
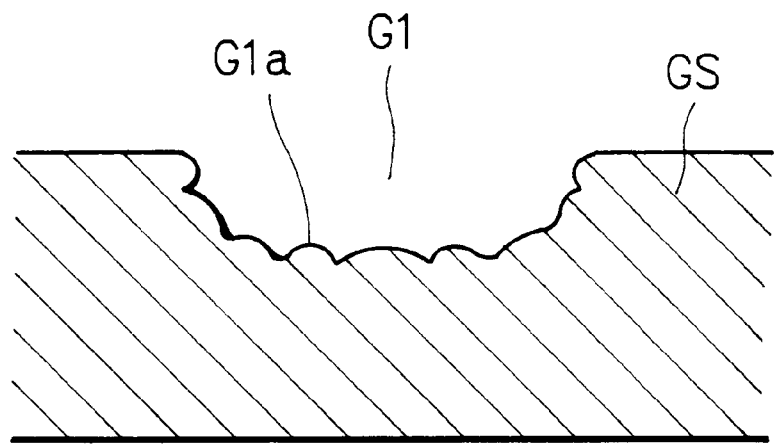
FIG. 49 is a cross-sectional view of the groove of a green sheet.
Figure 50:
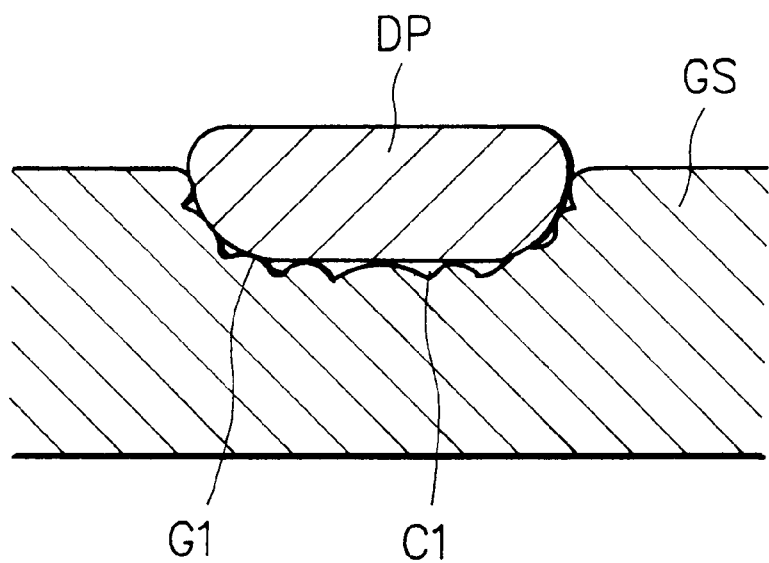
FIG. 50 is a view showing how a conductor pattern is formed.

Shown in FIG. 49 and FIG. 50 is an irregular portion formed to the inner surface of a groove.

A groove G1 which approximately conforms to the printed shape of a conductor pattern DP is formed to the upper surface of a green sheet GS to a predetermined depth and many irregularities G1a are formed to the inner surface of the groove G1. The irregular portion G1a may be formed to a ordering shape, in addition to the illustrated example formed to a random shape.

The groove G1 is formed using the laser processing apparatus shown in FIG. 4, FIG. 30, FIG. 36 or FIG. 38. More specifically, the groove G1 is formed in such a manner that the normal pulse laser beam generated from the YAG laser or the like is irradiated to the mask having the light transmitting portion similar to the conductor pattern, the laser beam having passed through the light transmitting portion is focussed by the lens on the upper surface of the green sheet GS in the same shape as that of the conductor pattern and the portion of the green sheet GS is melted and vaporized. The depth of the groove G1 can be adjusted by the output energy of the laser beam and the irregular portion G1a can be simply formed by a method of remaining melted residuals produced when the laser beam is irradiated as they are without removing them, a method of lightly pressing the inner surface of the groove by a metal mold having an irregular surface after the groove G1 is formed by the irradiation of the laser beam, and the like.

The green sheet GS has the conductor pattern DP formed in the groove G1 thereof using the screen printer shown in FIG. 6. Almost all the portions of the conductor pattern DP are accommodated in the groove G1 with only the upper surface portion thereof slightly projecting from the upper surface of the green sheet GS. Further, a lot of gaps C1 are formed between the conductor pattern DP and the irregular portion G1a in the inner surface of the groove G1 in correspondence with the recesses of the irregular portion G1a.

When another green sheet is stacked to the green sheet GS to which the conductor pattern has been formed, the portion of the conductor pattern DP in the vicinity of the irregular portion invades into the gaps C1 to thereby lower the upper surface of the conductor pattern DP, by which the stress applied to the portion of the upper sheet in contact with the conductor pattern is reduced to thereby prevent the increase of the density of the portion.

Since the projecting height of the conductor pattern DP can be lowered by the depth of the groove G1 by previously forming the groove G1 on the surface of the green sheet GS, the size of components is not increased even if the number of windings of a coil conductor is increased or the thickness of the conductor pattern DP is increased and further stacked layers are prevented from being dislocated when they are stacked.

The stress applied to the portion where the upper sheet is in contact with the conductor layer in stacking is reduced by causing a portion oh the conductor pattern to invade into the gaps C1 formed between the irregular portion G1a on the inner surface of the groove G1 and the conductor pattern DP to thereby prevent the increase of the density of the portion, whereby stable electrical properties can be obtained.

Further, since the groove G1 is formed by partially eliminating the green sheet GS by the irradiation of the laser beam, the density of the bottom of the groove is not increased as in the case in which a groove is formed by pressing a metal mold, which prevent the change of the size of the groove caused by restoration and the like and contributes to the stabilization of the above electrical properties.

Figure 51:
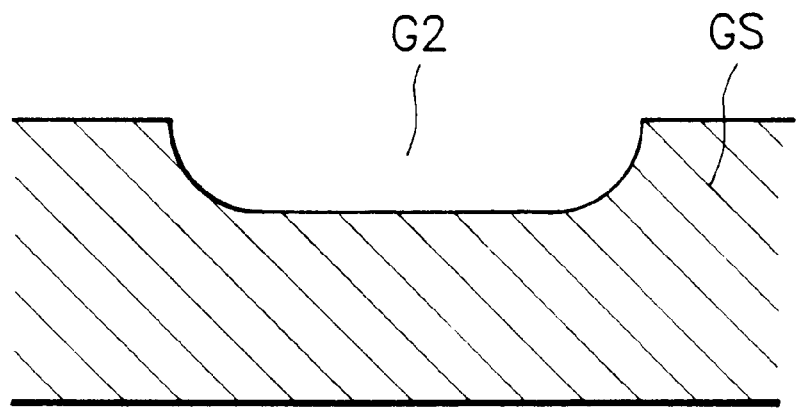
FIG. 51 is a cross-sectional view of the groove of a green sheet.
Figure 52:
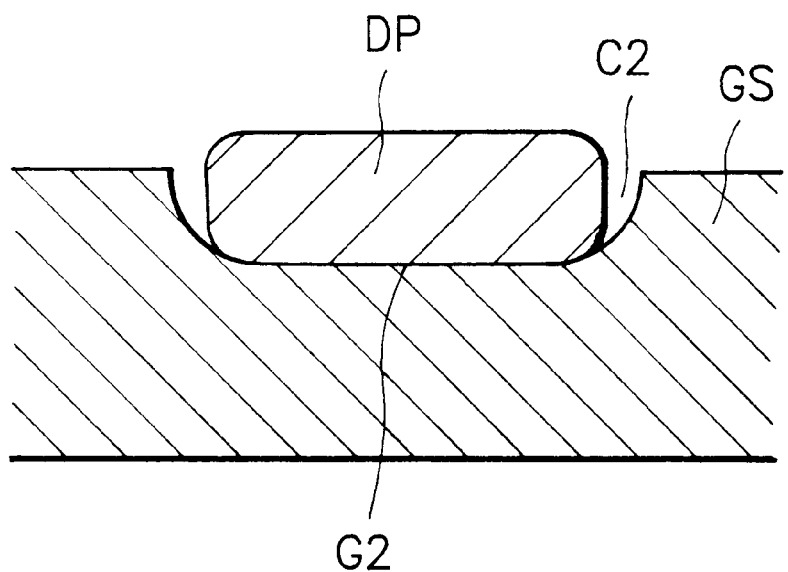
FIG. 52 is a view showing how a conductor pattern is formed.

FIG. 51 and FIG. 52 shows a case that the width of a groove is made larger than the width of a conductor pattern.

A groove G2 having a width larger than that of the printed shape of a conductor pattern DP is formed on the upper surface of a green sheet GS to a predetermined depth. The groove G2 is formed using the laser processing apparatus shown in FIG. 4, FIG. 30, FIG. 36 or FIG. 38.

The green sheet GS has the conductor pattern DP formed in the groove G2 thereof using the screen printer shown in FIG. 6. Almost all the portions of the conductor pattern DP are accommodated in the groove G2 with only the upper surface portion thereof slightly projecting from the upper surface of the green sheet GS. Further, a gap C2 based on the difference of the widths of the conductor pattern DP and the groove G2 is formed between the conductor pattern DP and the surface of the groove G2 in the width direction thereof.

When another green sheet is stacked to the green sheet GS to which the conductor pattern has been formed, the portion of the conductor pattern DP in the width direction thereof invades into the gap C2 to thereby lower the upper surface of the conductor pattern DP, by which the stress applied to the portion of the upper sheet in contact with the conductor pattern is reduced when it is stacked to thereby prevent the increase of the density of the portion. A resulting advantage is the same as that shown in FIG. 49 and FIG. 50.

Figure 53:
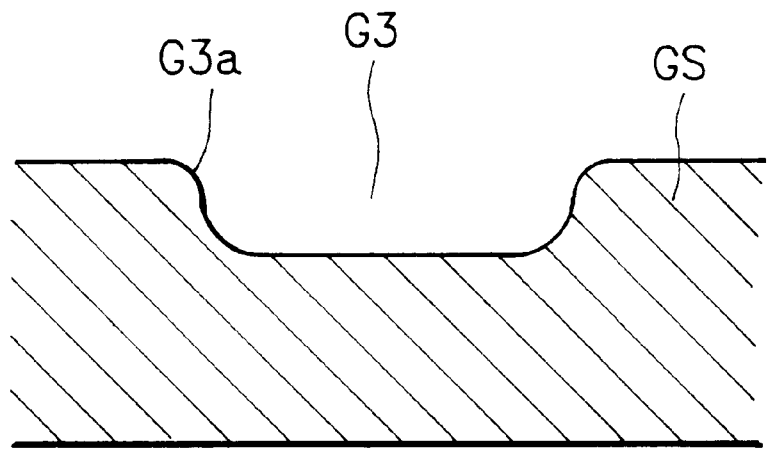
FIG. 53 is a cross-sectional view of the groove of a green sheet.
Figure 54:
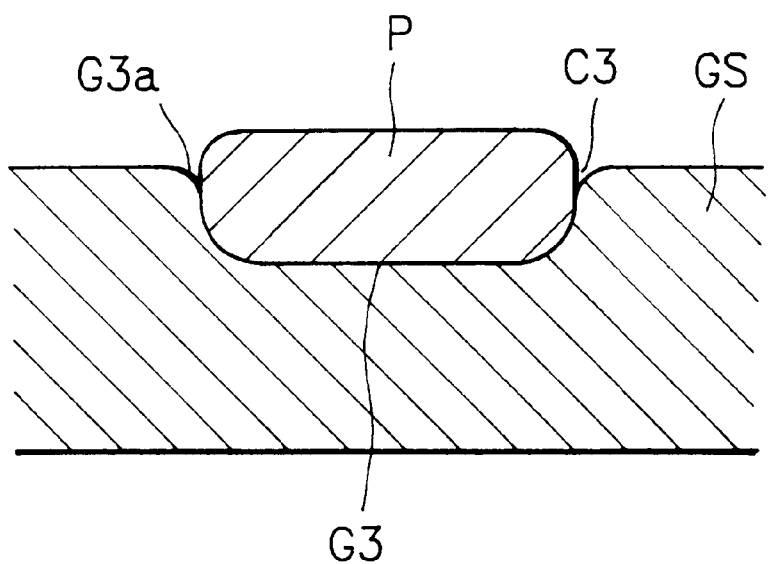
FIG. 54 is a view showing how a conductor pattern is formed.

FIG. 53 and FIG. 54 show an example in which a chamfered portion is formed to the opening edge of a groove.

A groove G3 which approximately conforms to the printed shape of a conductor pattern DP is formed to the upper surface of a green sheet GS to a predetermined depth and a curved chamfered portion G3a is formed along the opening edge of the groove G3. The chamfered portion G3a may be formed to a taper shape in addition to the illustrated example formed to a curved shape. The groove G3 is formed using the laser machining apparatus shown in FIG. 4, FIG. 30, FIG. 36 or FIG. 38.

The green sheet GS has the conductor pattern DP formed in the groove G3 thereof using the screen printer shown in FIG. 6. Almost all the portions of the conductor pattern DP are accommodated in the groove G3 with only the upper surface portion thereof slightly projecting from the upper surface of the green sheet GS. Further, a gap C3 in correspondence to the size of the chamfered portion G3a is formed between the conductor pattern DP and the chamfered portion G3a of the groove G3.

When another green sheet is stacked to the green sheet GS to which the conductor pattern has been formed, the portion of the conductor pattern DP in the vicinity of the chamfered portion invades into the gap C3 to thereby lower the upper surface of the conductor pattern DP, by which the stress applied to the portion of the upper sheet in contact with the conductor layer is reduced to thereby prevent the increase of the density of the portion. A resulting advantage is the same as that shown in FIG. 49 and FIG. 50.

Although the previously described first to fourth embodiments show the case that the connecting end of the conductor pattern is overlapped with the single through hole, when a plurality of through holes are formed in the region where the connecting end of the conductor pattern is overlapped, adjacent conductor patterns can be connected to each other well through the green sheet even if the position where the conductor pattern is formed is displaced from the positions where the through holes are formed. The specific examples of them will be introduced below.

FIG. 55–FIG. 58 show the case that 9 pieces in total of through holes SH are formed in a rectangular region S1.

A green sheet GS has the 9 pieces in total of the through holes which are two-dimensionally disposed to the region S1 in the form of 3×3 where the connecting end of the conductor pattern DP is partially overlapped and the connecting end of the conductor pattern DP is overlapped with the two through holes SH among the nine through holes.

To indicate this using specific numerical values, when it is assumed that the conductor pattern DP has a width of 150 $\mu$m, the lateral side and the longitudinal side of the region S1 are set to 250 $\mu$m, respectively, the diameter of the through holes is set to 50 $\mu$m and the center pitch between the through holes is set to 100 $\mu$m.

The above through holes SH are formed using the laser processing apparatus shown in FIG. 30, FIG. 36 or FIG. 38. More specifically, a group of nine pieces of the through holes are formed at a time in such a manner that the normal pulse laser beam generated from the YAG laser or the like is irradiated to a mask having a plurality of light transmitting portions similar to the through holes, the laser beams having passed through the light transmitting portions are forcussed by a lens on the upper surface of the green sheet GS in the same shapes as those of the through holes and the portions of the green sheet GS are melted and vaporized.

Figure 55:
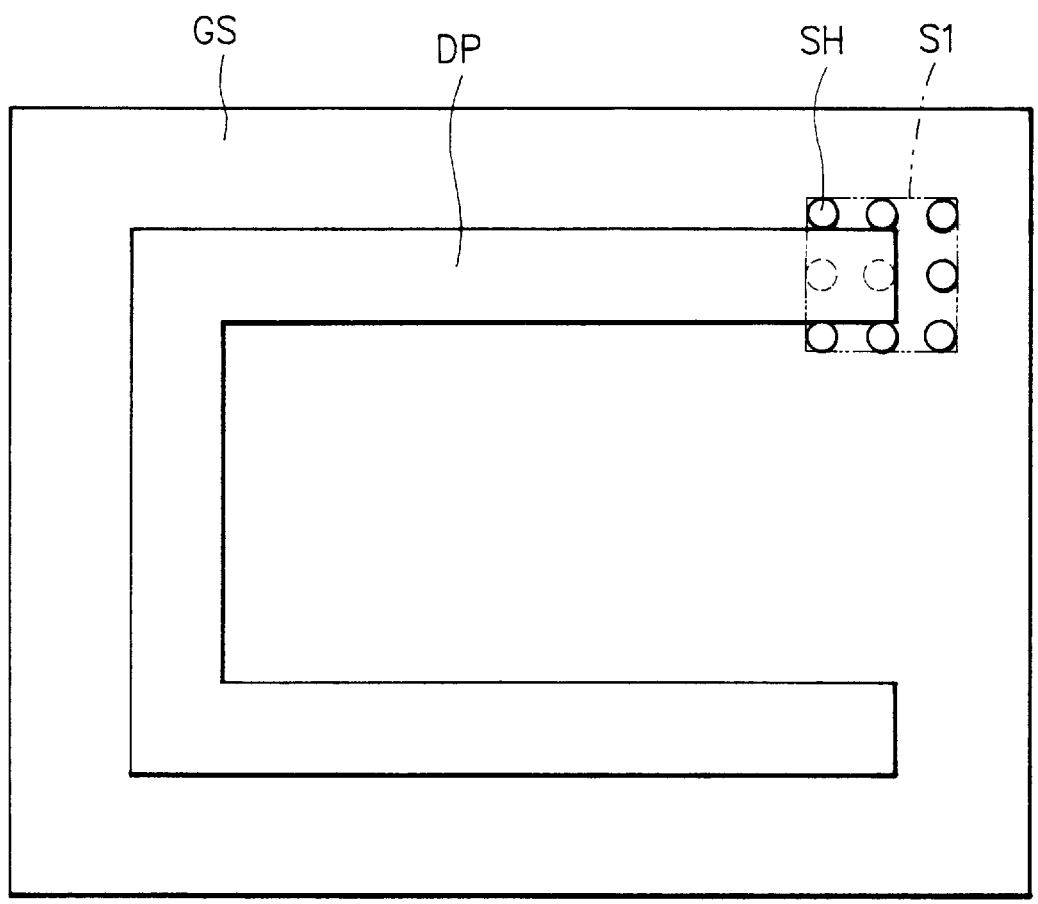
FIG. 55 is an top view showing how a conductor pattern is formed to a green sheet to which through holes have been formed.

When the group of 9 pieces of the through holes SH as shown in FIG. 55 are formed, even if the through holes SH are formed by being dislocated from their target positions, it is possible to overlap the connecting end of the conductor pattern DP to a portion of the nine through holes in the region S1 and connect adjacent conductor patterns DP to each other through the green sheet GS.

Figure 56:
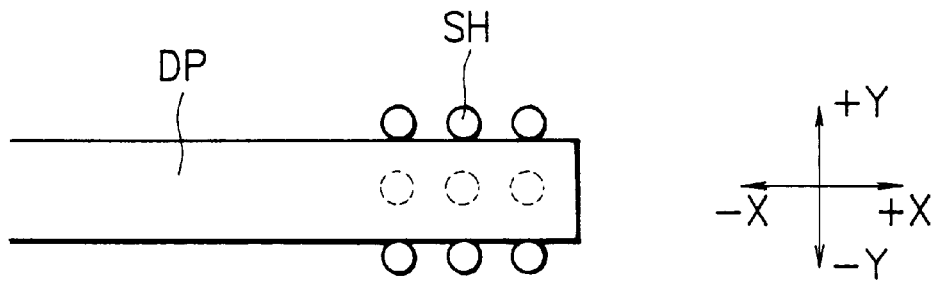
FIG. 56 is a view shown how a conductor pattern overlaps with through holes.
Figure 57:
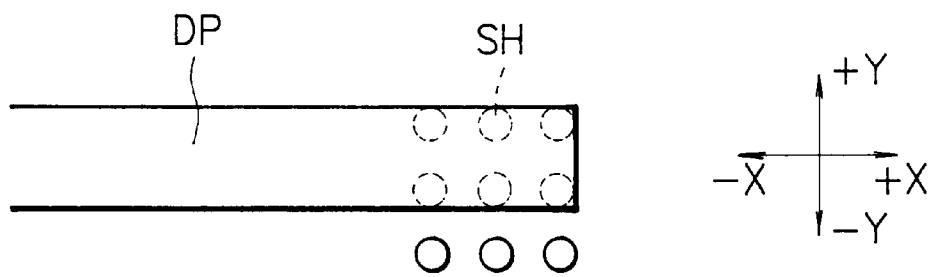
FIG. 57 is a view shown how a conductor pattern overlaps with through holes.
Figure 58:
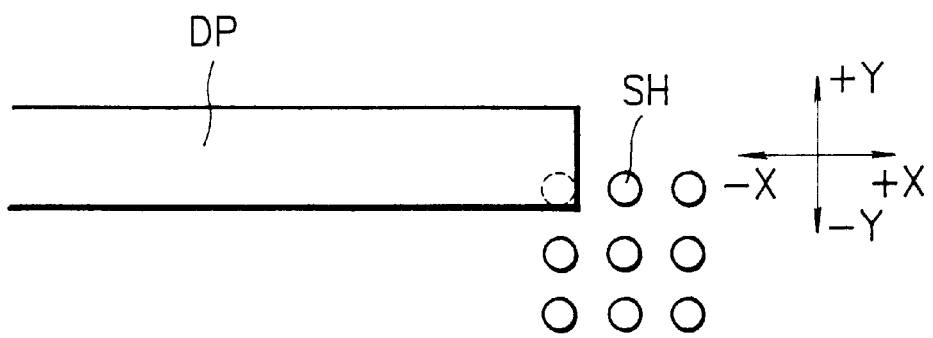
FIG. 58 is a view shown how a conductor pattern overlaps with through holes.
Figure 59:
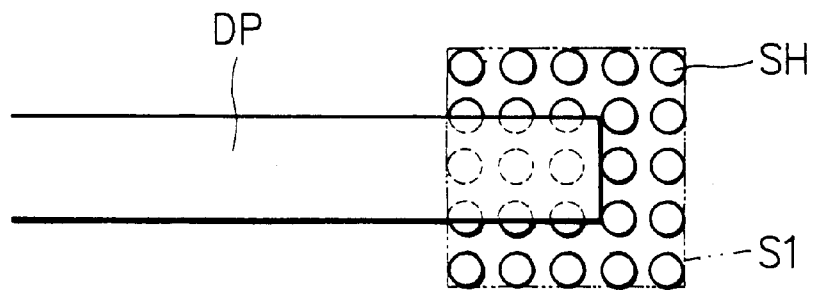
FIG. 59 is a view showing an example of the formation of through holes.

For example, when the positions where the through holes are formed are dislocated 150 $\mu$m in the −X direction, the end of the conductor pattern DP covers the three through holes as shown in FIG. 56. When the positions where the through holes are formed are dislocated 100 $\mu$m in the −X direction and 50 $\mu$m in the −Y direction, the end of the conductor pattern DP covers the six through holes as shown in FIG. 57. Further, when the positions where the through holes are formed are dislocated 100 $\mu$m in the +X direction and 150 $\mu$m in the −Y direction, the conductor pattern DP conforms to the one through holes as shown in FIG. 58. In any case, the adjacent conductor patterns 1 adjacent to each other through the green sheet GS are connected to each other through one to a plurality of the through holes SH without causing any problem. It is needless to say that even if the position where the conductor pattern is formed is dislocated, the conductor pattern DP can be connected well in such a manner that the connecting end of the conductor pattern is overlapped to a part of the nine through holes in the region S1 likewise the above.

The number of the through holes and the pitch at which they are formed can be variously changed. That is, when the number of the through holes SH formed in the same region S1 is increased and the forming pitch is made smaller, a positional dislocation compensating ability can improved and the conducting area of the conductor patterns can be enlarged.

Figure 60:
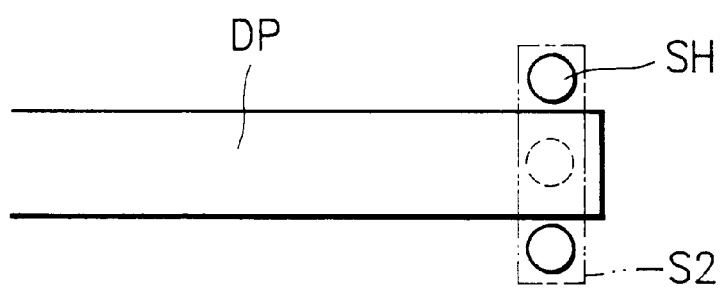
FIG. 60 is a view showing an example of the formation of through holes.
Figure 61:
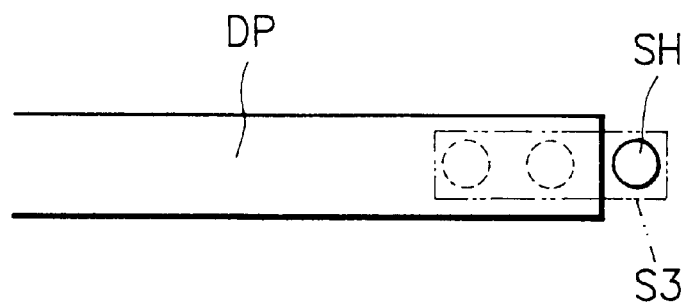
FIG. 61 is a view showing an example of the formation of through holes.

The size of the through hole forming region can be suitably increased or decreased depending upon the possible range of positional dislocation made when the through holes SH are formed. For example, when the positional dislocation appears only in the ±Y direction of FIG. 60, it suffices only to set a region S2 in the direction and form a plurality of the through holes SH in the region S2. When the positional dislocation appears only in the ±X direction of FIG. 56, it suffices only to set a region S3 in the direction and form a plurality of the through holes SH in the region S3 as shown in FIG. 61.

Figure 62:
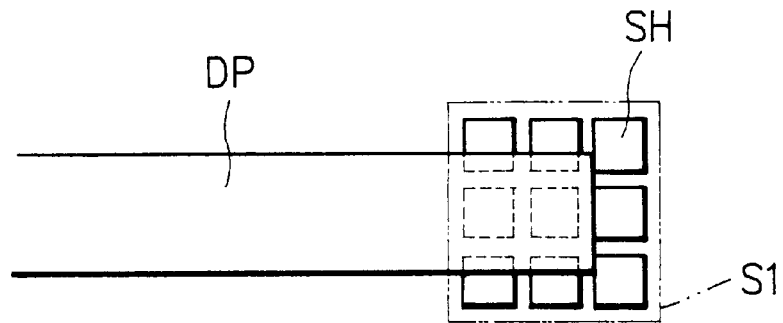
FIG. 62 is a view showing an example of the formation of through holes.
Figure 63:
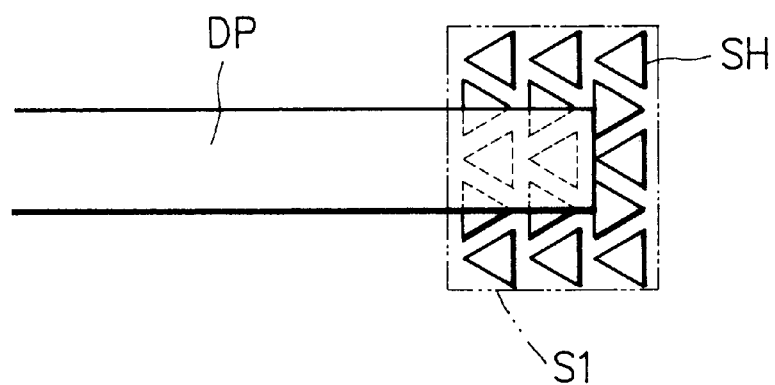
FIG. 63 is a view showing an example of the formation of through holes.

The shape of the through hole is not limited to the above circle but it may be a polygon such as a square (refer to FIG. 62), a triangle (refer to FIG. 63), or an ellipse. When the through hole SH is a polygon, it is formed with a high density without a gap as compared with the circle and the ellipse, which is advantageous to increase the conductive area of the conductor patterns.

Figure 64:
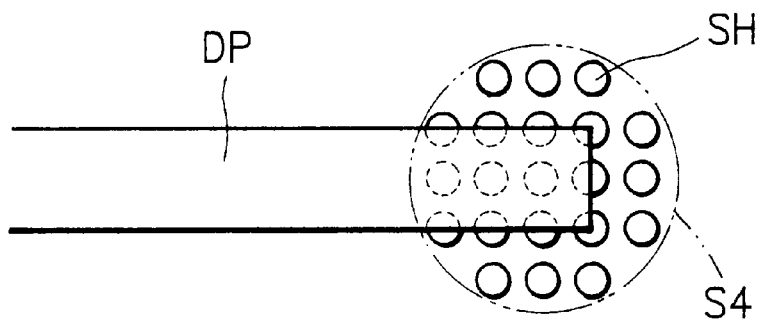
FIG. 64 is a view showing an example of the formation of through holes.

Further, the shape of the through hole forming region is not limited to the above rectangle but it can be a circle (refer to S4 of FIG. 64) or any other shape and the shape of the region may be set according to the contour of the dislocated range mentioned previously.

The application of the present invention is not limited to the multilayer chip inductor but it is also widely applicable to any other multilayer ceramic electronic components such as a multilayer chip bead, a multilayer transformer, multilayer composite components, a multilayer hybrid integrated circuit and the like in which through holes and coil conductor patters are formed to a ceramic green sheet and can achieve similar advantages.

We claim:

1. A method of manufacturing a multilayer ceramic electronic component comprising:

a process X of forming a through hole in an area of a ceramic green sheet adhered to a base film;

a process Y of forming a conductor pattern on said ceramic green sheet where a part of said conductor pattern overlaps the area;

a process Z of repeatedly stacking the ceramic green sheet having the through hole and the conductor pattern to another ceramic green sheet until a predetermined number of ceramic green sheets are multilayered, process Z including peeling the base film from the ceramic green sheet; and executing said process X by irradiating a side of the ceramic green sheet with a laser beam to form the through hole in the area of the ceramic green sheet without forming a through hole in the base film and forming a plurality of through holes in a predetermined region which is to overlapped by the end of the conductor pattern.

2. The method of claim 1, wherein the size and position of the region where the through holes are formed are based on a range of a positional dislocation which occurs when the through holes are formed.

3. The method of claim 1, wherein the through holes are formed to have a polygonal shape.

4. A method of manufacturing a multilayer ceramic electronic component comprising:

forming a through hole in an area of a ceramic green sheet adhered to a base film by irradiating a side of the ceramic green sheet with a laser beam to form the through hole in the area of the ceramic green sheet without forming a through hole in the base film;

forming a conductor pattern on said ceramic green sheet where a part of said conductor pattern overlaps the area by: forming the ceramic green sheet on the base film, forming a groove on the ceramic sheet, forming a chamfered portion along an open end of the groove while the groove is formed on the surface of the green sheet, and forming the conductor pattern in the groove on the ceramic green sheet;

repeatedly stacking the ceramic green sheet having the through hole and the conductor pattern to another ceramic green sheet having the through hole and a conductor pattern until a predetermined number of ceramic green sheets are multilayered; and peeling the base film while the ceramic green sheets are stacked.

* * * * *